United States Patent
Pan et al.

(10) Patent No.: US 12,369,366 B2
(45) Date of Patent: Jul. 22, 2025

(54) CONVERGENT FIN AND NANOSTRUCTURE TRANSISTOR STRUCTURE AND METHOD

(71) Applicant: Taiwan Semiconductor Manufacturing Co., Ltd., Hsinchu (TW)

(72) Inventors: Kuan-Ting Pan, Hsinchu (TW); Kuo-Cheng Chiang, Hsinchu (TW); Shi Ning Ju, Hsinchu (TW); Yi-Ruei Jhan, Hsinchu (TW); Yen-Ming Chen, Hsinchu (TW); Chih-Hao Wang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 695 days.

(21) Appl. No.: 17/480,103

(22) Filed: Sep. 20, 2021

(65) Prior Publication Data
US 2022/0328625 A1   Oct. 13, 2022

Related U.S. Application Data

(60) Provisional application No. 63/172,854, filed on Apr. 9, 2021.

(51) Int. Cl.
| H10D 30/01 | (2025.01) |
| H10D 30/67 | (2025.01) |
| H10D 62/10 | (2025.01) |
| H10D 84/01 | (2025.01) |
| H10D 84/03 | (2025.01) |

(52) U.S. Cl.
CPC ........ *H10D 62/118* (2025.01); *H10D 30/031* (2025.01); *H10D 30/6735* (2025.01); *H10D 30/6757* (2025.01); *H10D 62/115* (2025.01); *H10D 84/013* (2025.01); *H10D 84/0151* (2025.01); *H10D 84/038* (2025.01)

(58) Field of Classification Search
CPC ..... H01L 21/823481; H01L 21/823878; H01L 29/42392; H01L 29/78696; H01L 29/0673; H10D 84/0151; H10D 84/0188; H10D 30/026; H10D 30/031
See application file for complete search history.

(56) References Cited

U.S. PATENT DOCUMENTS

| 9,236,267 | B2 | 1/2016 | De et al. |
| 9,502,265 | B1 | 11/2016 | Jiang et al. |
| 9,520,466 | B2 | 12/2016 | Holland et al. |
| 9,520,482 | B1 | 12/2016 | Chang et al. |
| 9,536,738 | B2 | 1/2017 | Huang et al. |
| 9,576,814 | B2 | 2/2017 | Wu et al. |

(Continued)

*Primary Examiner* — Kevin Parendo
(74) *Attorney, Agent, or Firm* — Seed IP Law Group LLP

(57) ABSTRACT

A device includes a substrate, a first semiconductor fin over the substrate extending in a first lateral direction, a first vertical stack of semiconductor nanosheets over the substrate extending in the first lateral direction, and an inactive fin between the first semiconductor fin and the first vertical stack extending in the first lateral direction. A first gate structure surrounds and covers the first semiconductor fin, and extends in a second lateral direction substantially perpendicular to the first lateral direction. A second gate structure surrounds and covers the first vertical stack, and extends in the second lateral direction.

20 Claims, 40 Drawing Sheets

(56) References Cited

U.S. PATENT DOCUMENTS

| | | |
|---|---|---|
| 9,608,116 B2 | 3/2017 | Ching et al. |
| 9,786,774 B2 | 10/2017 | Colinge et al. |
| 9,853,101 B2 | 12/2017 | Peng et al. |
| 9,881,993 B2 | 1/2018 | Ching et al. |
| 10,832,916 B1* | 11/2020 | Xie ................. H01L 21/823437 |
| 2019/0198629 A1* | 6/2019 | Yeung ................. H10D 30/014 |
| 2019/0319028 A1* | 10/2019 | Suh ....................... H01L 29/045 |
| 2020/0098878 A1* | 3/2020 | Guler ............. H01L 21/823418 |
| 2021/0036121 A1* | 2/2021 | Lim .................. H01L 29/78696 |
| 2022/0037495 A1* | 2/2022 | Kang ................ H01L 29/66439 |

\* cited by examiner

CONVERGENT FIN AND NANOSTRUCTURE TRANSISTOR STRUCTURE AND METHOD

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
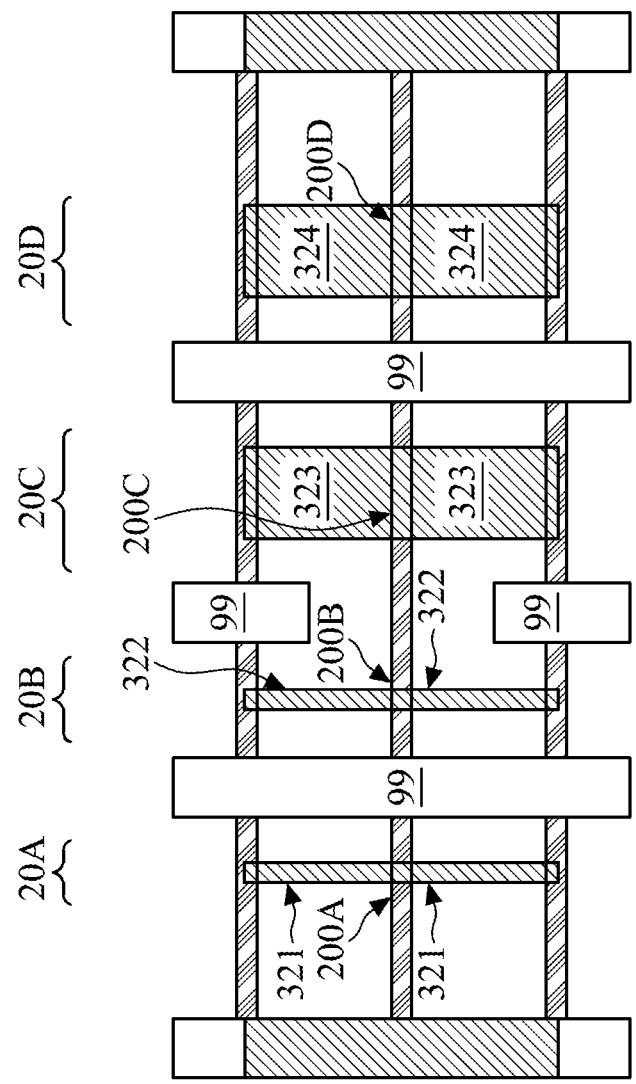
FIGS. 1A-1D are diagrammatic top and cross-sectional side views of a portion of an IC device fabricated according to embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Terms indicative of relative degree, such as "about," "substantially," and the like, should be interpreted as one having ordinary skill in the art would in view of current technological norms. Generally, the term "substantially" indicates a tighter tolerance than the term "about." For example, a thickness of "about 100 units" will include a larger range of values, e.g., 70 units to 130 units (+/−30%), than a thickness of "substantially 100 units," which will include a smaller range of values, e.g., 95 units to 105 units (+/−5%). Again, such tolerances (+/−30%, +/−5%, and the like) may be process- and/or equipment-dependent, and should not be interpreted as more or less limiting than a person having ordinary skill in the art would recognize as normal for the technology under discussion, other than that "about" as a relative term is not as stringent as "substantially" when used in a similar context.

The present disclosure is generally related to semiconductor devices, and more particularly to integrated circuits including field-effect transistors (FETs), such as planar FETs, three-dimensional fin-line FETs (FinFETs), and/or gate-all-around FET (GAAFET) devices. In advanced technology nodes, cell height scaling can be constrained by layout restrictions on spacing between gate isolation ("cut metal gate") structures and neighboring semiconductor fins related to overlap and critical dimension. A FinFET and GAAFET convergent scheme disclosed herein improves spacing constraints by employing a fabrication process that forms FinFETs and GAAFETs in a single IC cell, such as a static random access memory (SRAM) cell.

The gate-all-around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

FIGS. 1A-1D illustrate diagrammatic top and cross-sectional side views of a portion of an IC device 10 fabricated according to embodiments of the present disclosure, where the IC device 10 includes fin devices 20A, 20B and gate-all-around (GAA) devices 20C, 20D. FIG. 1A is a diagrammatic top view of the portion of the IC device 10 including the fin devices 20A, 20B and GAA devices 20C, 20D. Certain features are removed from view intentionally in the top view of FIG. 1A for simplicity of illustration. The fin devices 20A, 20B and/or the GAA devices 20C, 20D may include at least an N-type FET (NFET) or a P-type FET (PFET) in some embodiments. Integrated circuit devices such as the IC device 10 frequently include transistors having different threshold voltages based on their function in the IC device. For example, input/output (IO) transistors typically have the highest threshold voltages, core logic transistors typically have the lowest threshold voltages, and a third threshold voltage between that of the IO transistors and that of the core logic transistors may also be employed for certain other functional transistors, such as static random access memory (SRAM) transistors. Some circuit blocks within the IC device 10 may include two or more NFETs and/or PFETs of two or more different threshold voltages. In some embodiments, the fin devices 20A, 20B are p-type FinFETs, and the GAA devices 20C, 20D are n-type GAAFETs. The p-type FinFETs may provide improved mobility, while the n-type GAAFETs may provide improved current compared to schemes in which only FinFETs or only GAAFETs are used. In addition to higher current, the GAAFETs may have lower swing/drain-induced barrier lowering and better short-channel control.

Figure 1B:
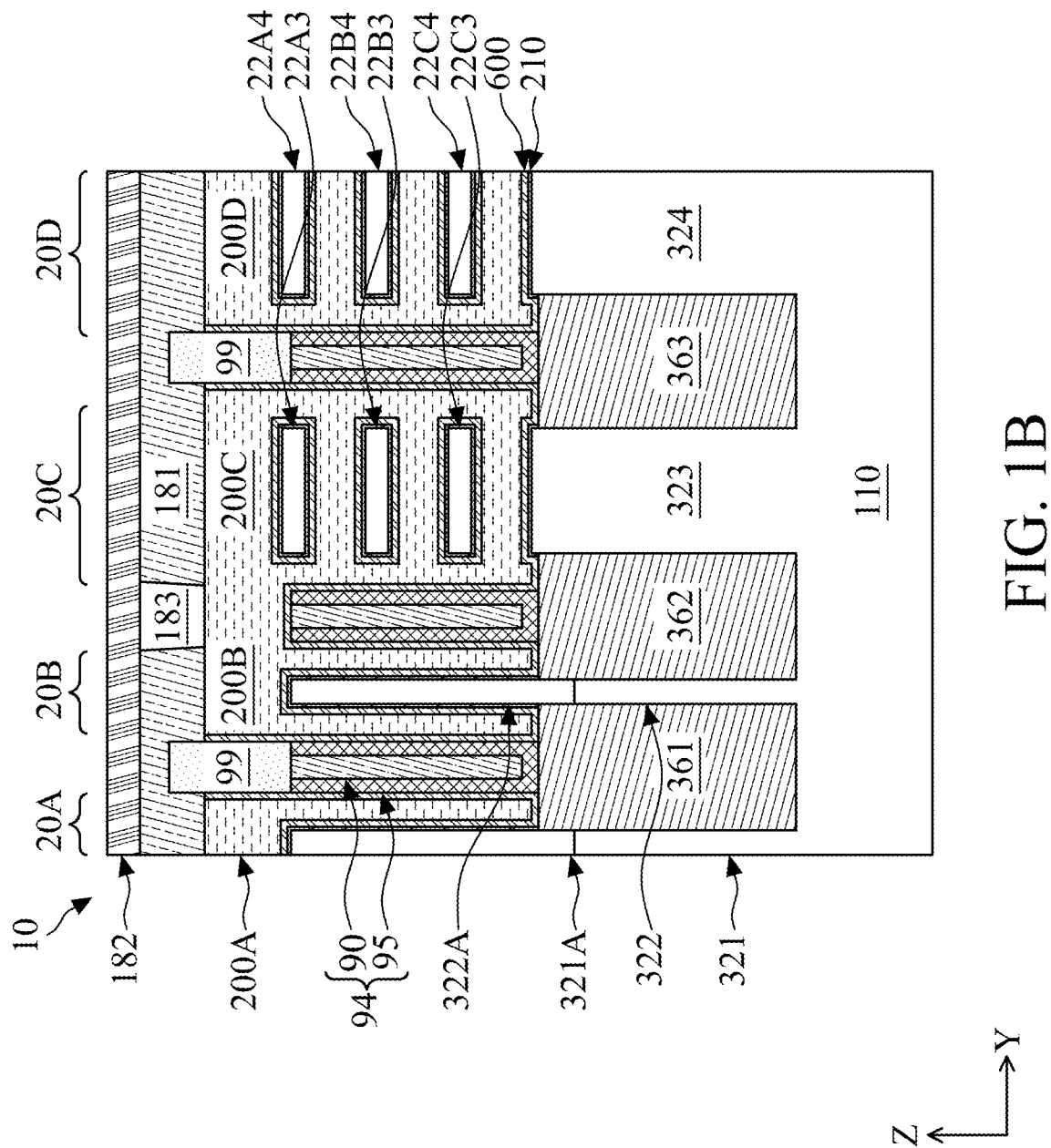

Shown in FIG. 1A and FIG. 1B, the fin devices 20A, 20B and the GAA devices 20C, 20D are formed over and/or in a substrate 110 (see FIG. 1B), and generally include gate structures 200A-200D straddling semiconductor fins 321, 322 (or simply "fins 321, 322") and semiconductor channels, alternately referred to as "nanostructures," located over semiconductor fins 323, 324 (or simply "fins 323, 324") protruding from, and separated by, isolation structures 361-363 (see FIG. 1). The channels are labeled "22AX" to "22CX," where "X" is an integer from 3 to 4, corresponding to the two transistors 20C, 20D, respectively. Each gate structure 200A-200D controls current flow through the fins 321, 322 or through the channels 22A3-22C4.

Effective width, which may indicate dimension of contact between channel and gate in the Y-Z plane, may be different for the fin devices 20A, 20B and the GAA devices 20C, 20D. For example, the fin device 20A may have effective width including width of the top surface of the fin 321, and also including height of sidewalls of the fin 321 above the isolation regions 361, 362. In some embodiments, the width of the top surface of the fin 321 may be in a range of about 5 nm to about 10 nm, and the height of the sidewalls of the fin 321 may be in a range of about 40 nm to about 60 nm. As such, the effective width of each of the fin devices 20A, 20B may be in a range of about 85 nm to about 130 nm.

For the GAA devices 20C, 20D, the effective width may include the dimensions (height, width) of contact between each nanosheet (e.g., the nanostructure 22A3) and the gate structure (e.g., the gate structure 200C) surrounding the nanosheet. Taking the GAA device 20C as an example, the effective width of the GAA device 20C may further be multiplied by number of nanostructures 22 (e.g., 3) in the GAA device 20C. The top and bottom surfaces of the nanostructures 22 may have width in a range of about 8 nm to about 70 nm. The lateral sidewall surfaces of the nanostructures 22 may have height in a range of about 5 nm to about 8 nm. As such, the effective width for a single nanostructure 22 (e.g., the nanostructure 22A3) may be in a range of about 26 nm to about 156 nm. Number of nanostructures 22 in each GAA device 20C, 20D may be in a range of about 2 to about 4. As such, the effective width for each GAA device 20C, 20D may be in a range of about 52 nm to about 624 nm.

A ratio of effective width of the GAA devices 20C, 20D to effective width of the fin devices 20A, 20B may be in a range of about 0.4 to about 8. In some embodiments, the top surfaces of the fins 321, 322 may each be narrower than the upper and lower surfaces of each of the nanostructures 22, as shown in FIG. 1B.

In many IC devices, it is preferable for the gate structures of two or more neighboring GAA devices to be electrically connected. In a typical process, material layers of gate structures are formed over a large number of adjacent semiconductor fins, and isolation structures formed before or after the material layers are used to "cut" the material layers to isolate certain portions of the material layers from other portions. Each portion of the material layers may be one or more gate structures corresponding to one or more GAA devices. For illustrative purposes, in the configuration shown in FIGS. 1A-1C, two gate isolation structures 99 isolate the four gate structures 200A-200D, such that the gate structures 200B, 200C are electrically connected, and the gate structure 200A, the gate structures 200B, 200C, and the gate structure 200D are electrically isolated from each other. The gate isolation structures 99 are alternatively referred to as "dielectric plugs 99." The gate isolation structures 99 extend vertically through the gate structures 200A-200D. The gate isolation structures 99 further contact inactive fin structures 94. The inactive fin structures 94 extend from substantially the top surface of the fins 321, 322 and the nanostructures 22A3, 22A4 to the isolation structures 361-363, such that the gate structures 200A-200D may be isolated laterally from each other, e.g., the gate structure 200A and the gate structure 200B are laterally isolated by the combination of one of the inactive fin structures 94 and one of the gate isolation structures 99. In the various embodiments of the disclosure, the inactive fin structures 94 are formed in a self-aligned process prior to formation of the gate structures 200A-200D, and the gate isolation structures 99 are formed in another self-aligned process following formation of the inactive fin structures 94. In some embodiments, the inactive fin structures 94 extend about 5 nm to about 25 nm above the upper surface of the fins 321, 322 and the channels 22A3, 22A4.

Figure 1C:
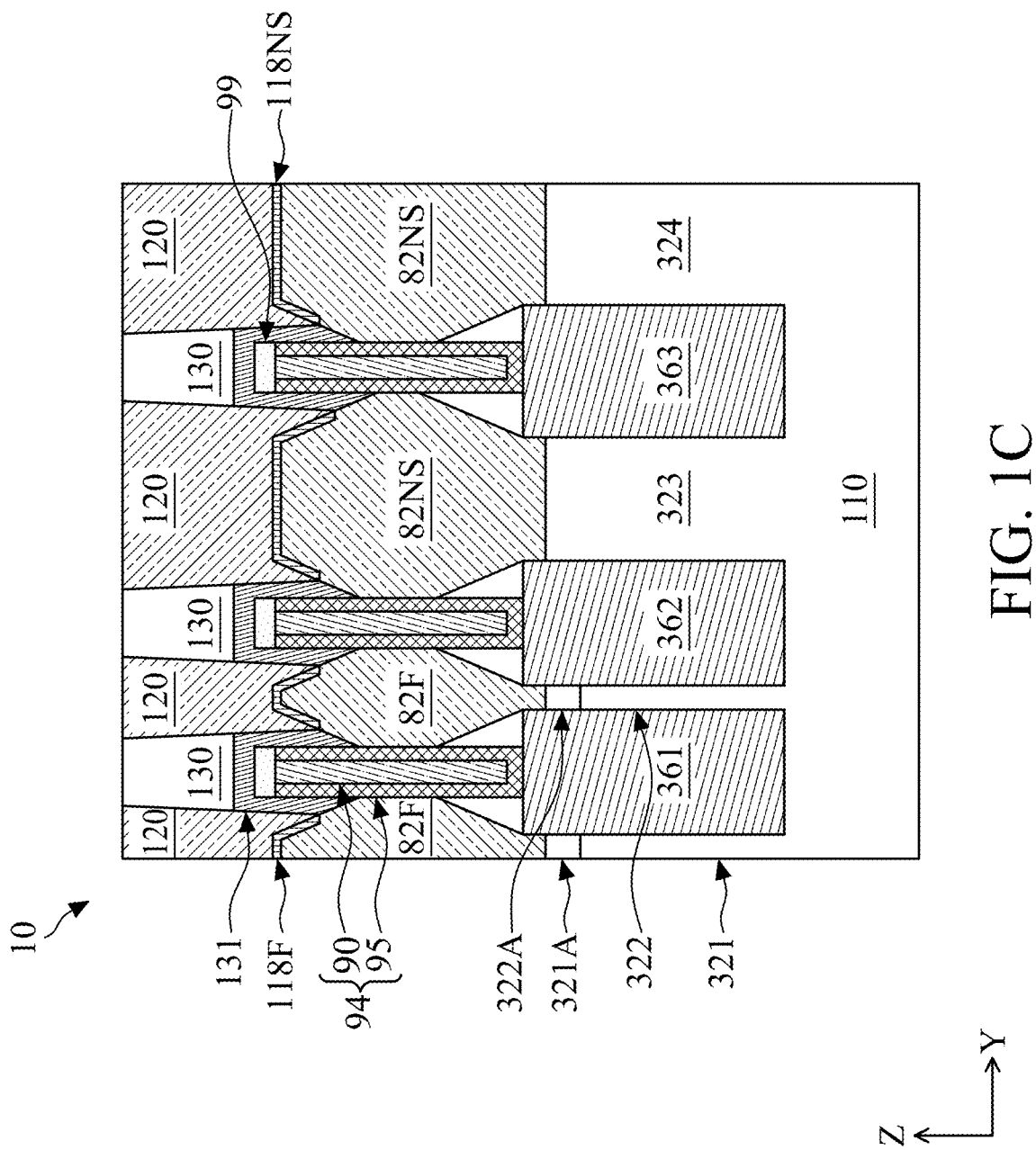
Figure 1D:
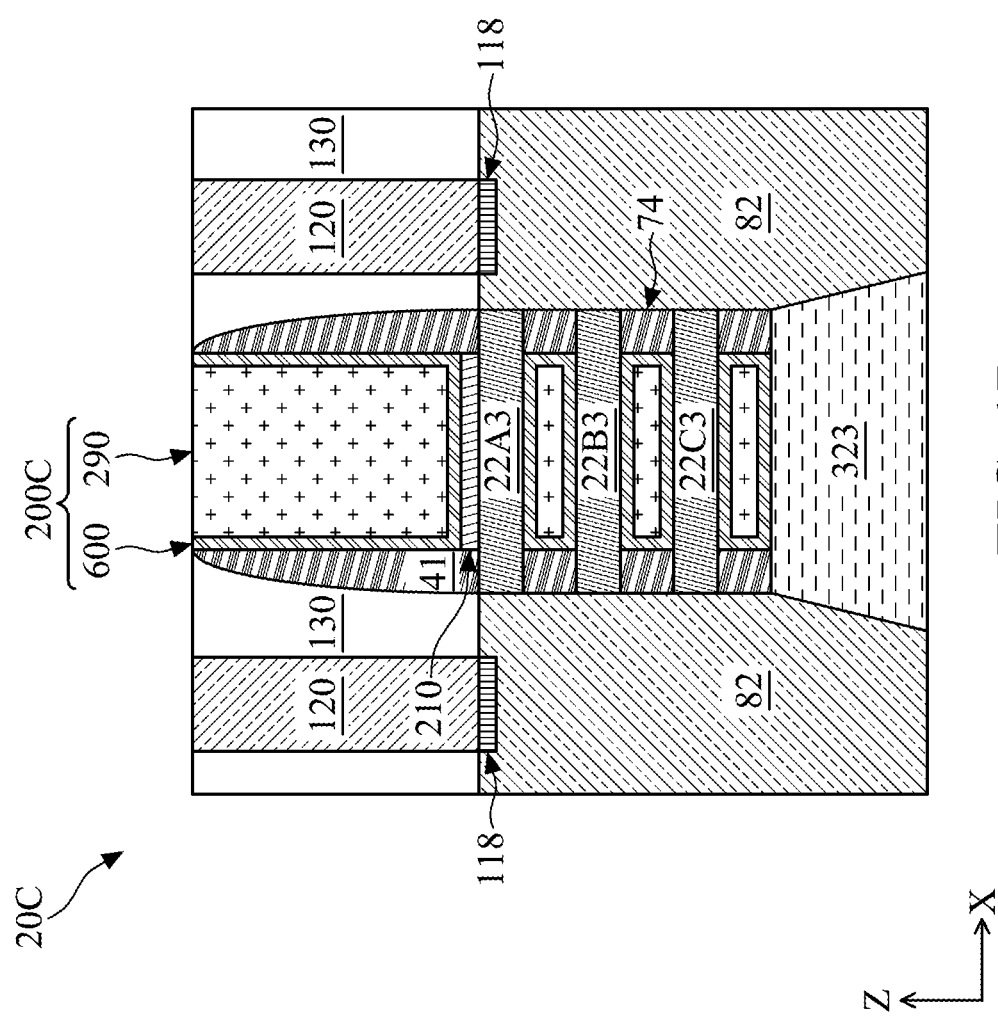

Referring to FIG. 1C and FIG. 1D, the cross-sectional view of the IC device 10 in FIG. 1C is taken along the Y-Z plane through source/drain features 82F, 82NS (also collectively referred to as "source/drain features 82"), and FIG. 1D is taken along an X-Z plane through the nanostructures 22A3-22C3 (as an example), where the X-direction is the horizontal direction, and the Z-direction is the vertical direction. The cross-sectional view in FIG. 1D shows a single GAA device 20C of the GAA devices 20C, 20D for simplicity of illustration, and the related description is generally applicable to the other fin devices 20A, 20B and GAA device 20D. The channels 22A3-22C3 are laterally abutted by source/drain features 82, and covered and surrounded by the gate structure 200C. The gate structure 200C controls flow of electrical current through the channels 22A3-22C3 to and from the source/drain features 82 based on voltages applied at the gate structure 200C and at the source/drain features 82. As shown in FIG. 1C, the source/drain features 82 are formed between the inactive fin structures 94, such that lateral sidewalls of the source/drain features 82 abut the inactive fin structures 94. In some embodiments, the source/drain features 82F have narrower width than the source/drain features 82NS, as shown.

In some embodiments, the fin structure 323 includes silicon. In some embodiments, the GAA device 20C is an NFET, and the source/drain features 82 thereof include silicon phosphorous (SiP). In some embodiments, the GAA device 20C is a PFET, and the source/drain features 82 thereof include silicon germanium (SiGe).

The channels 22A3-22C3 each include a semiconductive material, for example silicon or a silicon compound, such as silicon germanium, or the like. The channels 22A3-22C3 are nanostructures (e.g., having sizes that are in a range of a few nanometers) and may also each have an elongated shape and extend in the X-direction. In some embodiments, the channels 22A3-22C3 each have a nanowire (NW) shape, a nanosheet (NS) shape, a nanotube (NT) shape, or other suitable nanoscale shape. The cross-sectional profile of the channels 22A3-22C3 may be rectangular, round, square, circular, elliptical, hexagonal, or combinations thereof.

In some embodiments, the lengths (e.g., measured in the X-direction) of the channels 22A3-22C3 may be different from each other, for example due to tapering during a fin etching process. In some embodiments, length of the channel 22A3 may be less than a length of the channel 22B3, which may be less than a length of the channel 22C3. The channels 22A3-22C3 each may not have uniform thickness, for example due to a channel trimming process used to expand spacing (e.g., measured in the Z-direction) between the channels 22A3-22C3 to increase gate structure fabrication process window. For example, a middle portion of each of the channels 22A3-22C3 may be thinner than the two ends of each of the channels 22A3-22C3. Such shape may be collectively referred to as a "dog-bone" shape.

In some embodiments, the spacing between the channels 22A3-22C3 (e.g., between the channel 22B3 and the channel 22A3 or the channel 22C3) is in a range between about 8 nanometers (nm) and about 12 nm. In some embodiments, a thickness (e.g., measured in the Z-direction) of each of the channels 22A3-22C3 is in a range between about 5 nm and about 8 nm. In some embodiments, a width (e.g., measured in the Y-direction, not shown in FIG. 1D, orthogonal to the X-Z plane) of each of the channels 22A3-22C3 is at least about 8 nm.

The gate structure 200C is disposed over and between the channels 22A3-22C3, respectively. In some embodiments, the gate structure 200C is disposed over and between the channels 22A3-22C3, which are silicon channels for N-type devices or silicon germanium channels for P-type devices. In some embodiments, the gate structure 200C includes an interfacial layer (IL) 210, one or more gate dielectric layers 600, one or more work function tuning layers 900 (see FIG. 35), and a metal fill layer 290.

The interfacial layer 210, which may be an oxide of the material of the channels 22A3-22C3, is formed on exposed areas of the channels 22A3-22C3 and the top surface of the fin 323. The interfacial layer 210 promotes adhesion of the gate dielectric layers 600 to the channels 22A3-22C3. In some embodiments, the interfacial layer 210 has thickness of about 5 Angstroms (A) to about 50 Angstroms (A). In some embodiments, the interfacial layer 210 has thickness of about 10 A. The interfacial layer 210 having thickness that is too thin may exhibit voids or insufficient adhesion properties. The interfacial layer 210 being too thick consumes gate fill window, which is related to threshold voltage tuning and resistance as described above. In some embodiments, the interfacial layer 210 is doped with a dipole, such as lanthanum, for threshold voltage tuning.

In some embodiments, the gate dielectric layer 600 includes at least one high-k gate dielectric material, which may refer to dielectric materials having a high dielectric constant that is greater than a dielectric constant of silicon oxide (k≈3.9). Exemplary high-k dielectric materials include $HfO_2$, HfSiO, HfSiON, HfTaO, HfTiO, HfZrO, $ZrO_2$, $Ta_2O_5$, or combinations thereof. In some embodiments, the gate dielectric layer 600 has thickness of about 5 A to about 100 A.

In some embodiments, the gate dielectric layer 600 may include dopants, such as metal ions driven into the high-k gate dielectric from $La_2O_3$, MgO, $Y_2O_3$, $TiO_2$, $Al_2O_3$, $Nb_2O_5$, or the like, or boron ions driven in from $B_2O_3$, at a concentration to achieve threshold voltage tuning. As one example, for N-type transistor devices, lanthanum ions in higher concentration reduce the threshold voltage relative to layers with lower concentration or devoid of lanthanum ions, while the reverse is true for P-type devices. In some embodiments, the gate dielectric layer 600 of certain transistor devices (e.g., IO transistors) is devoid of the dopant that is present in certain other transistor devices (e.g., N-type core logic transistors or P-type IO transistors). In N-type IO transistors, for example, relatively high threshold voltage is desirable, such that it may be preferable for the IO transistor high-k dielectric layers to be free of lanthanum ions, which would otherwise reduce the threshold voltage.

Figure 35:
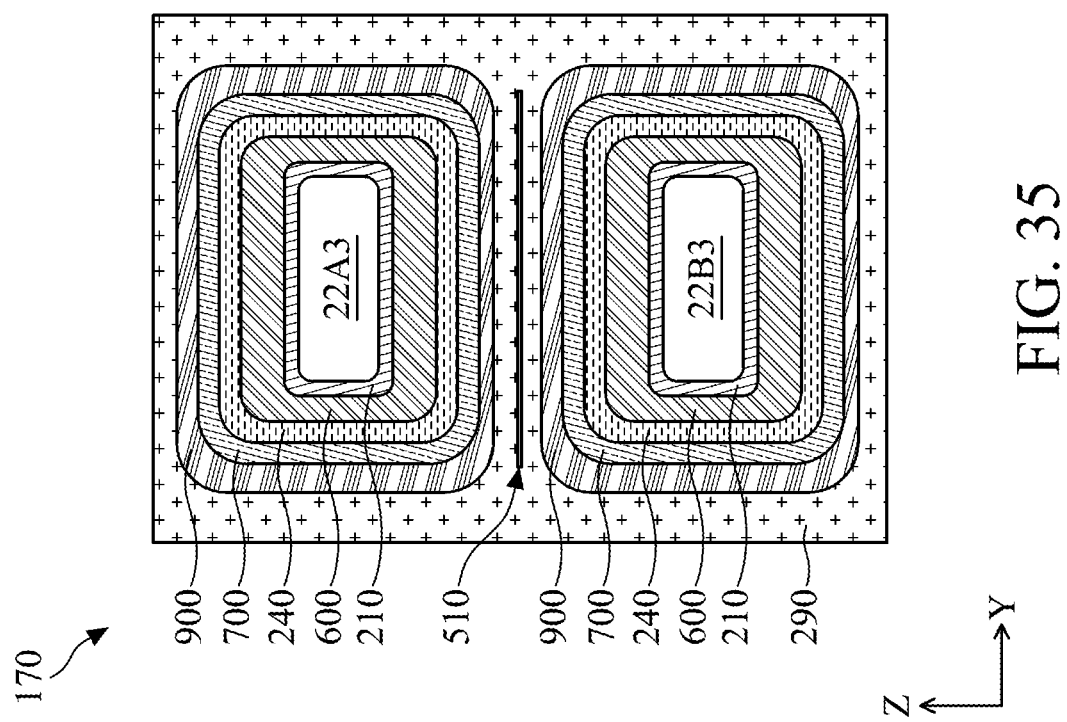

In some embodiments, the gate structure 200C further includes one or more work function metal layers, represented collectively as work function metal layer 900 (see FIG. 35). When configured as an NFET, the work function metal layer 900 of the GAA device 20C may include at least an N-type work function metal layer, an in-situ capping layer, and an oxygen blocking layer. In some embodiments, the N-type work function metal layer is or comprises an N-type metal material, such as TiAlC, TiAl, TaAlC, TaAl, or the like. The in-situ capping layer is formed on the N-type work function metal layer, and may comprise TiN, TiSiN, TaN, or another suitable material. The oxygen blocking layer is formed on the in-situ capping layer to prevent oxygen diffusion into the N-type work function metal layer, which would cause an undesirable shift in the threshold voltage. The oxygen blocking layer may be formed of a dielectric material that can stop oxygen from penetrating to the N-type work function metal layer, and may protect the N-type work function metal layer from further oxidation. The oxygen blocking layer may include an oxide of silicon, germanium, SiGe, or another suitable material. In some embodiments, the work function metal layer 900 includes more or fewer layers than those described.

The work function metal layer 900 may further include one or more barrier layers comprising a metal nitride, such as TiN, WN, MoN, TaN, or the like. Each of the one or more barrier layers may have thickness ranging from about 5 A to about 20 A. Inclusion of the one or more barrier layers provides additional threshold voltage tuning flexibility. In general, each additional barrier layer increases the threshold voltage. As such, for an NFET, a higher threshold voltage device (e.g., an IO transistor device) may have at least one or more than two additional barrier layers, whereas a lower threshold voltage device (e.g., a core logic transistor device) may have few or no additional barrier layers. For a PFET, a higher threshold voltage device (e.g., an IO transistor device) may have few or no additional barrier layers, whereas a lower threshold voltage device (e.g., a core logic transistor device) may have at least one or more than two additional barrier layers. In the immediately preceding discussion, threshold voltage is described in terms of magnitude. As an example, an NFET IO transistor and a PFET IO transistor may have similar threshold voltage in terms of magnitude, but opposite polarity, such as +1 Volt for the NFET IO transistor and −1 Volt for the PFET IO transistor. As such, because each additional barrier layer increases threshold voltage in absolute terms (e.g., +0.1 Volts/layer), such an increase confers an increase to NFET transistor threshold voltage (magnitude) and a decrease to PFET transistor threshold voltage (magnitude).

The gate structure 200C also includes metal fill layer 290. The metal fill layer 290 may include a conductive material such as tungsten, cobalt, ruthenium, iridium, molybdenum, copper, aluminum, or combinations thereof. Between the channels 22A3-22C3, the metal fill layer 290 are circumferentially surrounded (in the cross-sectional view) by the one or more work function metal layers 900, which are then circumferentially surrounded by the gate dielectric layers 600. The gate structure 200C may also include a glue layer that is formed between the one or more work function layers 900 and the metal fill layer 290 to increase adhesion. The glue layer is not specifically illustrated in FIG. 1D for simplicity.

The GAA devices 20C, 20D also include gate spacers 41 and inner spacers 74 that are disposed on sidewalls of the gate dielectric layer 600 and the IL 210. The inner spacers 74 are also disposed between the channels 22A3-22C3. The gate spacers 41 and the inner spacers 74 may include a dielectric material, for example a low-k material such as SiOCN, SiON, SiN, or SiOC.

The GAA devices 20C, 20D may further include source/drain contacts 120 (shown in FIG. 1C) that are formed over the source/drain features 82. The source/drain contacts 120 may include a conductive material such as tungsten, cobalt, ruthenium, iridium, molybdenum, copper, aluminum, or combinations thereof. The source/drain contacts 120 may be surrounded by barrier layers (not shown), such as SiN or TiN, which help prevent or reduce diffusion of materials from and into the source/drain contacts 120. A silicide layer 118 may also be formed between the source/drain features 82 and the source/drain contacts 120, so as to reduce the source/drain contact resistance. The silicide layer 118 may contain a metal silicide material, such as cobalt silicide in some embodiments, or TiSi in some other embodiments.

The GAA devices 20C, 20D further include an interlayer dielectric (ILD) 130. The ILD 130 provides electrical isolation between the various components of the GAA devices 20C, 20D discussed above, for example between the gate structure 200C and the source/drain contacts 120. An etch stop layer 131 (see FIG. 1C) may be formed prior to forming the ILD 130, and may be positioned laterally between the ILD 130 and the gate spacers 41 and vertically between the ILD 130 and the source/drain features 82.

Additional details pertaining to the fabrication of GAA devices are disclosed in U.S. Pat. No. 10,164,012, titled "Semiconductor Device and Manufacturing Method Thereof" and issued on Dec. 25, 2018, as well as in U.S. Pat. No. 10,361,278, titled "Method of Manufacturing a Semiconductor Device and a Semiconductor Device" and issued on Jul. 23, 2019, the disclosures of each which are hereby incorporated by reference in their respective entireties.

Figure 36:
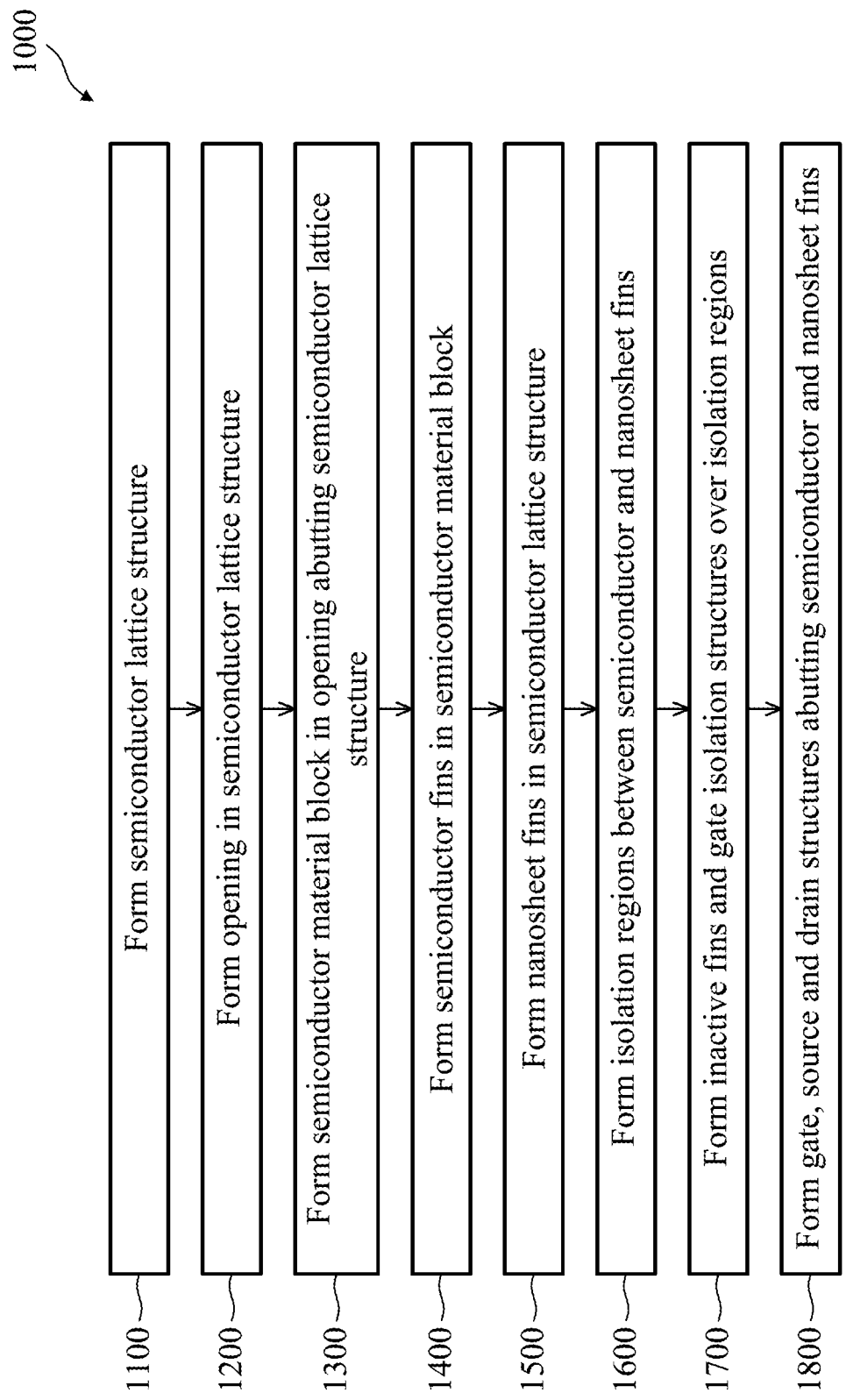
FIG. 36 is a flowchart illustrating a method of fabricating a semiconductor device according to various aspects of the present disclosure.

FIG. 36 illustrates a flowchart of a method 1000 for forming an IC device or a portion thereof from a workpiece, according to one or more aspects of the present disclosure. Method 1000 is merely an example and is not intended to limit the present disclosure to what is explicitly illustrated in method 1000. Additional acts can be provided before, during and after the method 1000, and some acts described can be replaced, eliminated, or moved around for additional embodiments of the methods. Not all acts are described herein in detail for reasons of simplicity. Method 1000 is described below in conjunction with fragmentary perspective and/or cross-sectional views of a workpiece, shown in FIGS. 2-35, at different stages of fabrication according to embodiments of method 1000. For avoidance of doubt, throughout the figures, the X direction is perpendicular to the Y direction and the Z direction is perpendicular to both the X direction and the Y direction. It is noted that, because the workpiece may be fabricated into a semiconductor device, the workpiece may be referred to as the semiconductor device as the context requires.

Figure 2:
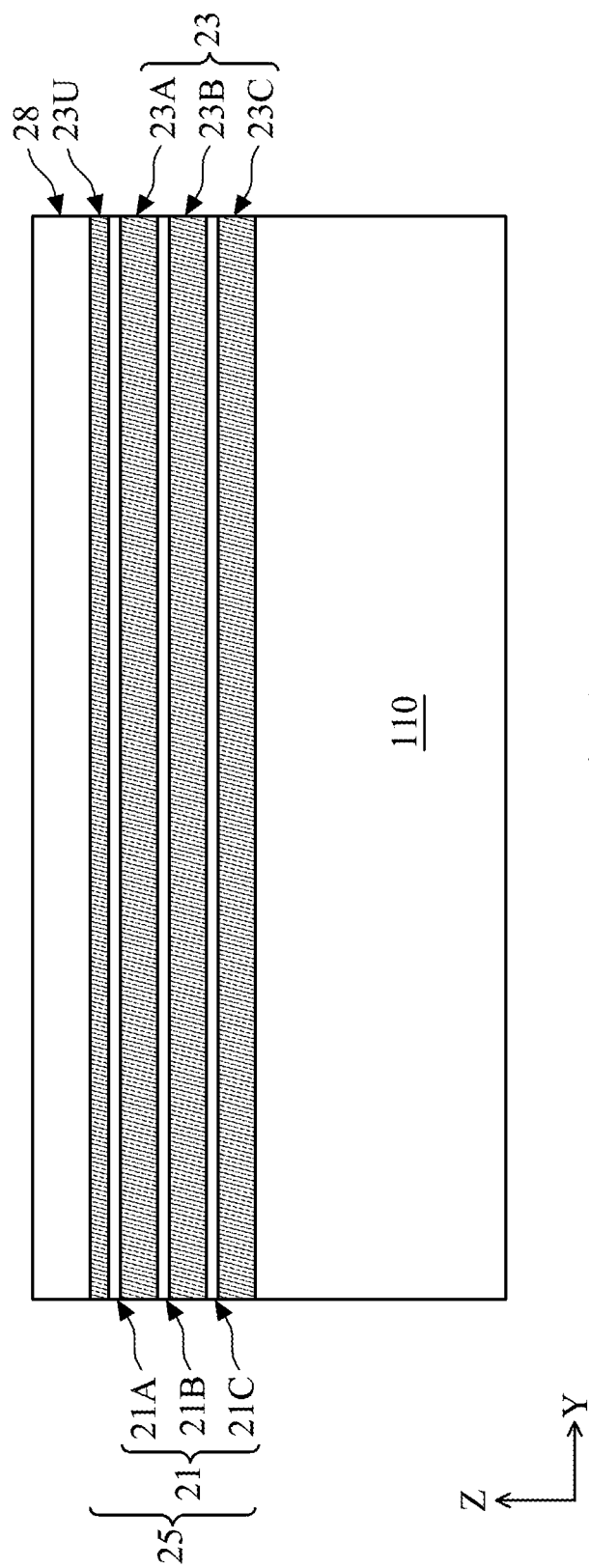
FIGS. 2-35 are views of various embodiments of an IC device of at various stages of fabrication according to various aspects of the present disclosure.

In FIG. 2, a substrate 110 is provided. The substrate 110 may be a semiconductor substrate, such as a bulk semiconductor, or the like, which may be doped (e.g., with a p-type or an n-type dopant) or undoped. The semiconductor material of the substrate 110 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof. Other substrates, such as single-layer, multi-layered, or gradient substrates may be used.

Figure 3:
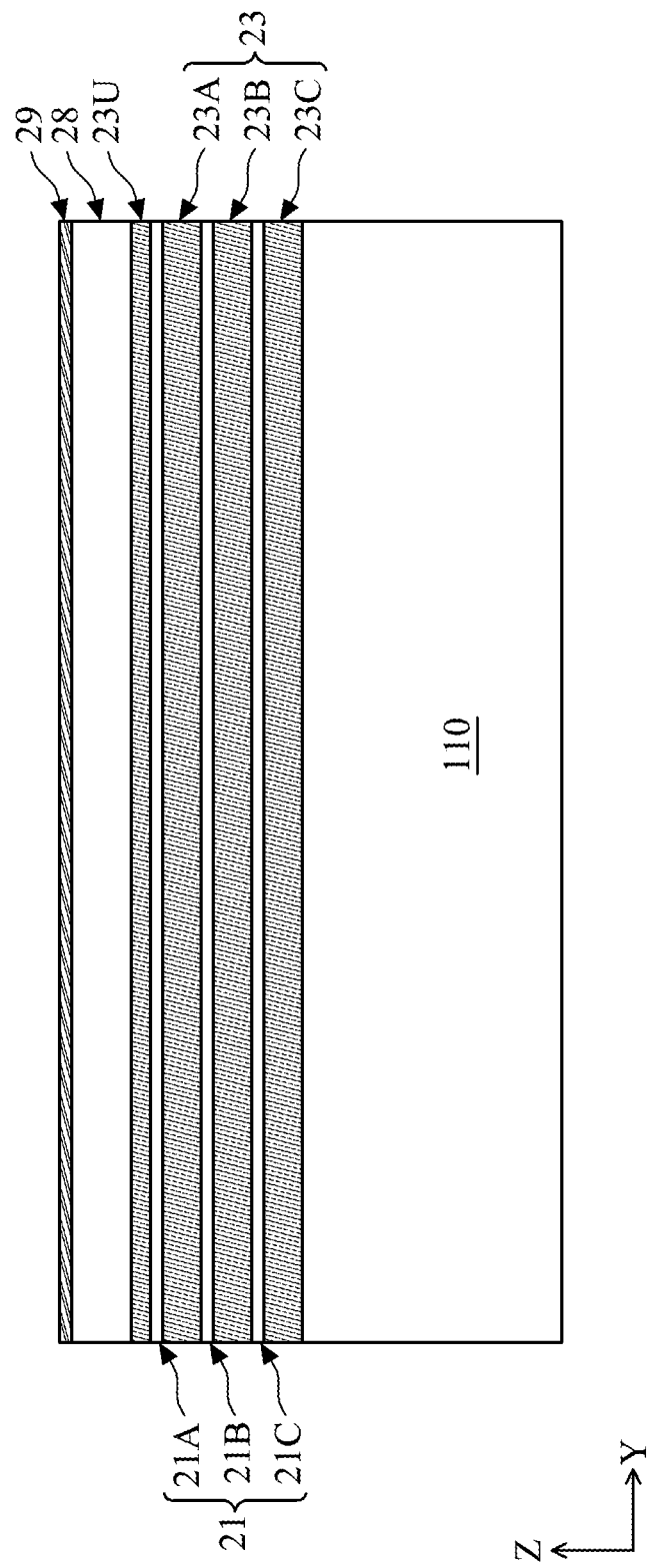

Further in FIG. 2, a multi-layer stack 25 or "lattice" is formed (corresponding to operation 1100 of FIG. 36) over the substrate 110 of alternating layers of first semiconductor layers 21A-21C (collectively referred to as first semiconductor layers 21), second semiconductor layers 23A-23C (collectively referred to as second semiconductor layers 23) and upper second semiconductor layer 23U. In some embodiments, the first semiconductor layers 21 may be formed of a first semiconductor material suitable for n-type nano-FETs, such as silicon, silicon carbide, or the like, and the second semiconductor layers 23 and upper second semiconductor layer 23U may be formed of a second semiconductor material suitable for p-type nano-FETs, such as silicon germanium or the like. Each of the layers of the multi-layer stack 25 may be epitaxially grown using a process such as chemical vapor deposition (CVD), atomic layer deposition (ALD), vapor phase epitaxy (VPE), molecular beam epitaxy (MBE), or the like. As shown in FIG. 3, a buffer layer 28 and hard mask layer 29 are formed over the top first semiconductor layer 21A. In some embodiments, the buffer layer 28 is a silicon layer, and the hard mask layer 29 may be a dielectric of silicon, such as silicon nitride, or the like. In some embodiments, the upper second semiconductor layer 23U is not present.

Three layers of each of the first semiconductor layers 21 and the second semiconductor layers 23 are illustrated. In some embodiments, the multi-layer stack 25 may include one or two each or four or more each of the first semiconductor layers 21 and the second semiconductor layers 23. Although the multi-layer stack 25 is illustrated as including a second semiconductor layer 23C as the bottommost layer, in some embodiments, the bottommost layer of the multi-layer stack 25 may be a first semiconductor layer 21.

Due to high etch selectivity between the first semiconductor materials and the second semiconductor materials, the second semiconductor layers 23 of the second semiconductor material may be removed without significantly removing the first semiconductor layers 21 of the first semiconductor material, thereby allowing the first semiconductor layers 21 to be patterned to form channel regions of nano-FETs. In some embodiments, the first semiconductor layers 21 are removed and the second semiconductor layers 23 are patterned to form channel regions. The high etch selectivity allows the first semiconductor layers 21 of the first semiconductor material to be removed without significantly removing the second semiconductor layers 23 of the second semiconductor material, thereby allowing the second semiconductor layers 23 to be patterned to form channel regions of nano-FETs.

Figure 4:
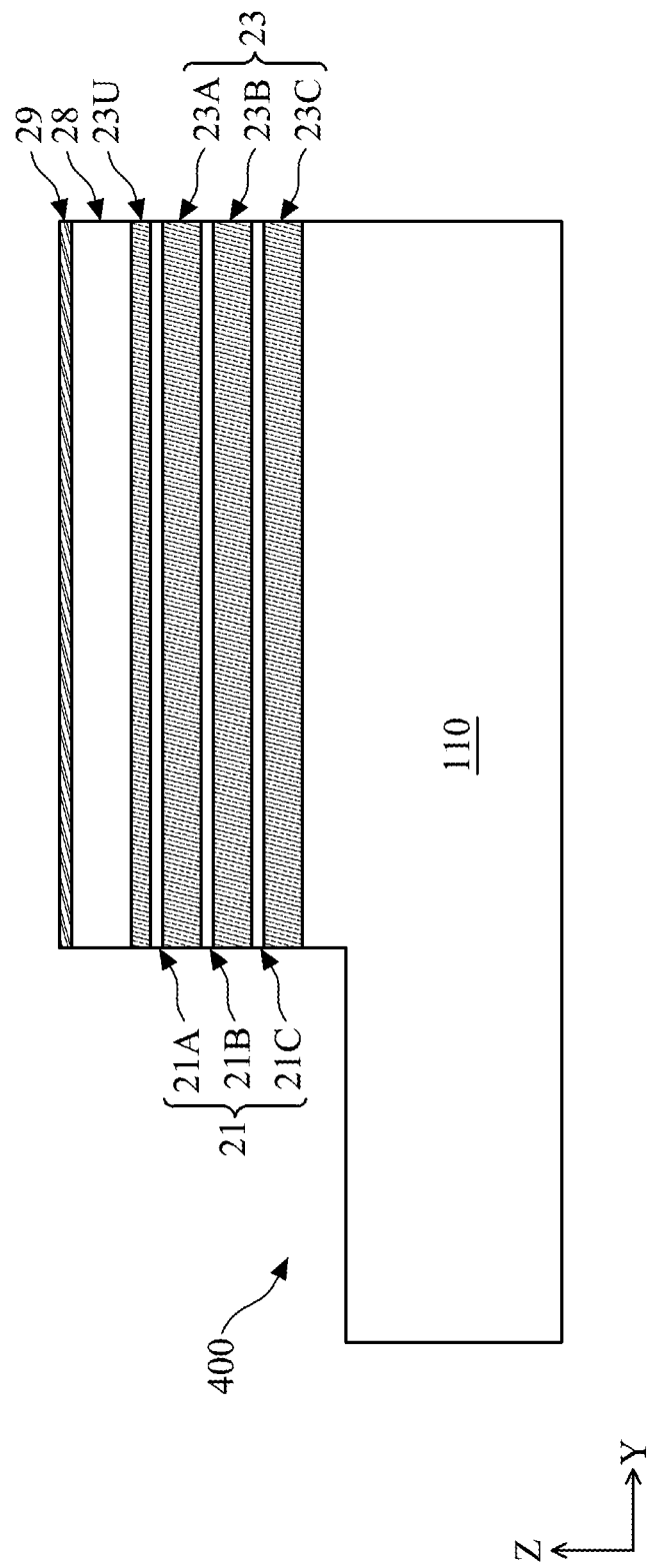

In FIG. 4, an opening 400 is formed through the hard mask layer 29, the buffer layer 28, the multi-layer stack 25 and a portion of the substrate 110, corresponding to operation 1200 of FIG. 36. The opening 400 is formed as a region in which fins 321, 322 (shown in FIG. 1B) will be formed in subsequent operations. In some embodiments, the opening 400 is formed by way of one or more etching operations, such as a first etching operation for etching through the hard mask layer 29, second etching operation for etching through the buffer layer 28, and alternating third and fourth etching operations for etching through the first semiconductor layers 21 and the semiconductor layers 23, as well as the portion of the substrate 110.

Figure 5:
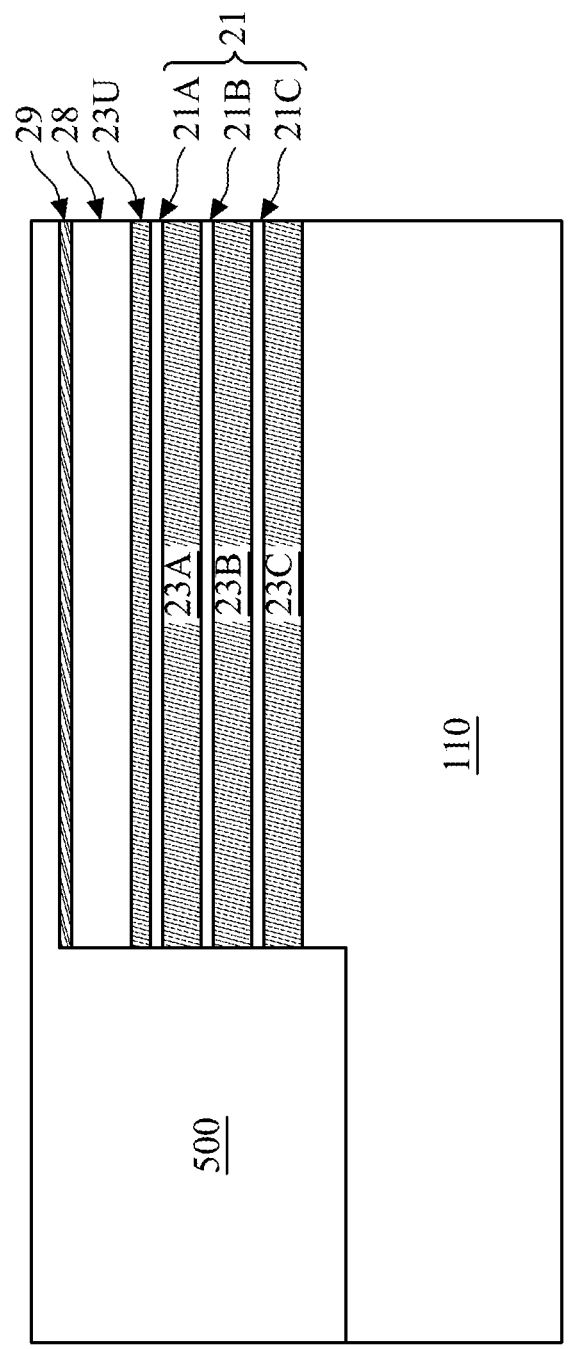

In FIG. 5, a fill material is filled into the opening 400, forming a fill layer 500 in the opening 400 and overlying the hard mask layer 29, corresponding to operation 1300 of FIG. 36. In some embodiments the fill material is silicon, silicon germanium, or other appropriate semiconductive material for forming the fins 321, 322. The fill layer 500 may be formed by an epitaxial deposition process, such as chemical vapor deposition (CVD) or other suitable deposition process.

Figure 6:
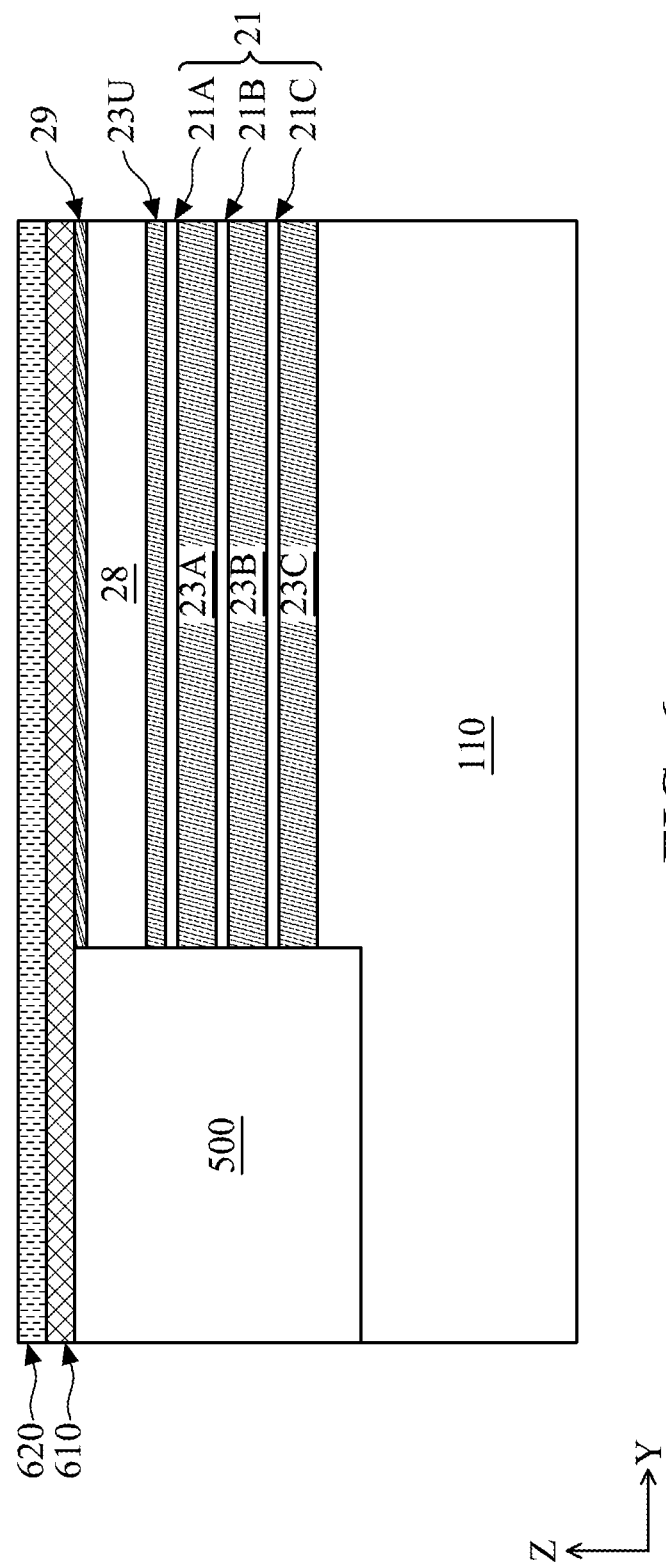

In FIG. 6, excess material of the fill layer 500 and a portion of the hard mask layer 29 may be removed by a planarization process, such as a chemical mechanical polishing/planarization process, or other appropriate process. Following the planarization process, one or more mask layers 610, 620 may be deposited over the fill layer 500 and the hard mask layer 29. In some embodiments, the one or more mask layers 610, 620 are hard mask layers, and may include dielectric materials, such as low-k or high-k dielectric materials. For example, the mask layer 610 may overlie the fill layer 500 and the hard mask layer 29, and may comprise silicon oxide, silicon nitride, silicon carbide, silicon oxynitride, silicon carbonitride, silicon oxycarbonitride, or the like. The mask layer 620 may overlie the mask layer 610, and may comprise a different dielectric material than the mask layer 610, which may be silicon oxide, silicon nitride, silicon carbide, silicon oxynitride, silicon carbonitride, silicon oxycarbonitride, or the like. The one or more mask layers 610, 620 may be used during formation of fins 321, 322 in subsequent operations.

Figure 7:
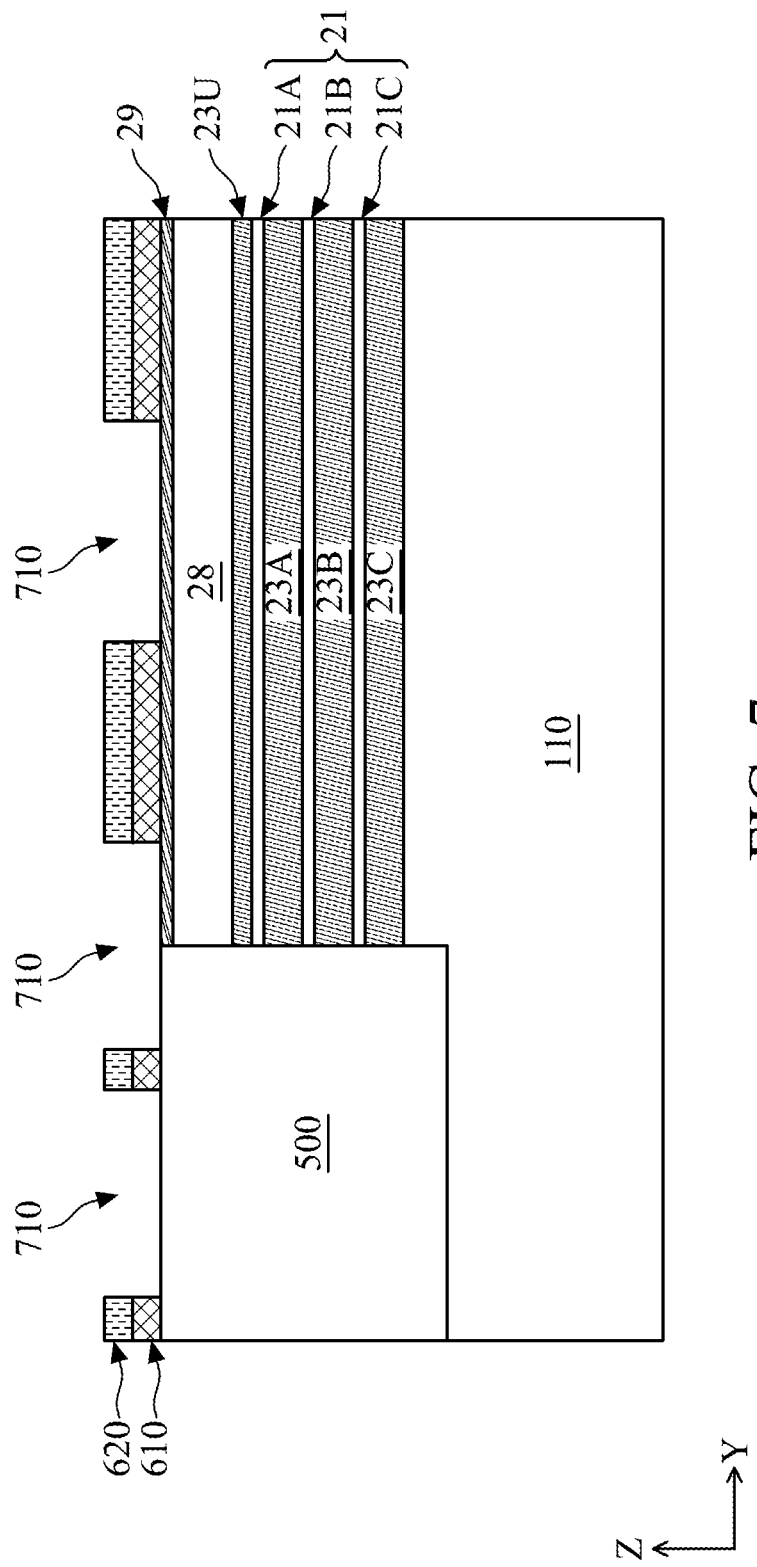

In FIG. 7, the one or more mask layers 610, 620 are patterned to form openings 710 in the one or more mask layers 610, 620 exposing upper surfaces of the fill layer 500 and the hard mask layer 29. In some embodiments, the openings 710 are formed using one or more photolithography operations, such as by forming a photomask of photoresist over the mask layer 620, exposing the photomask by extreme ultraviolet (EUV) light, and removing or keeping portions of the photomask exposed to the EUV light. Exposed portions of the mask layer 620 may be removed by etching through the photomask, then the openings 710 may be deepened by further etching through exposed portions of the mask layer 610. In some embodiments, at least one of the openings 710 exposes a region of the hard mask layer 29 overlying the multilayer stack 25, at least one of the openings 710 exposes a region of the hard mask layer 29 and a region of the fill layer 500, and at least one of the openings 710 exposes a region of the fill layer 500.

Figure 8:
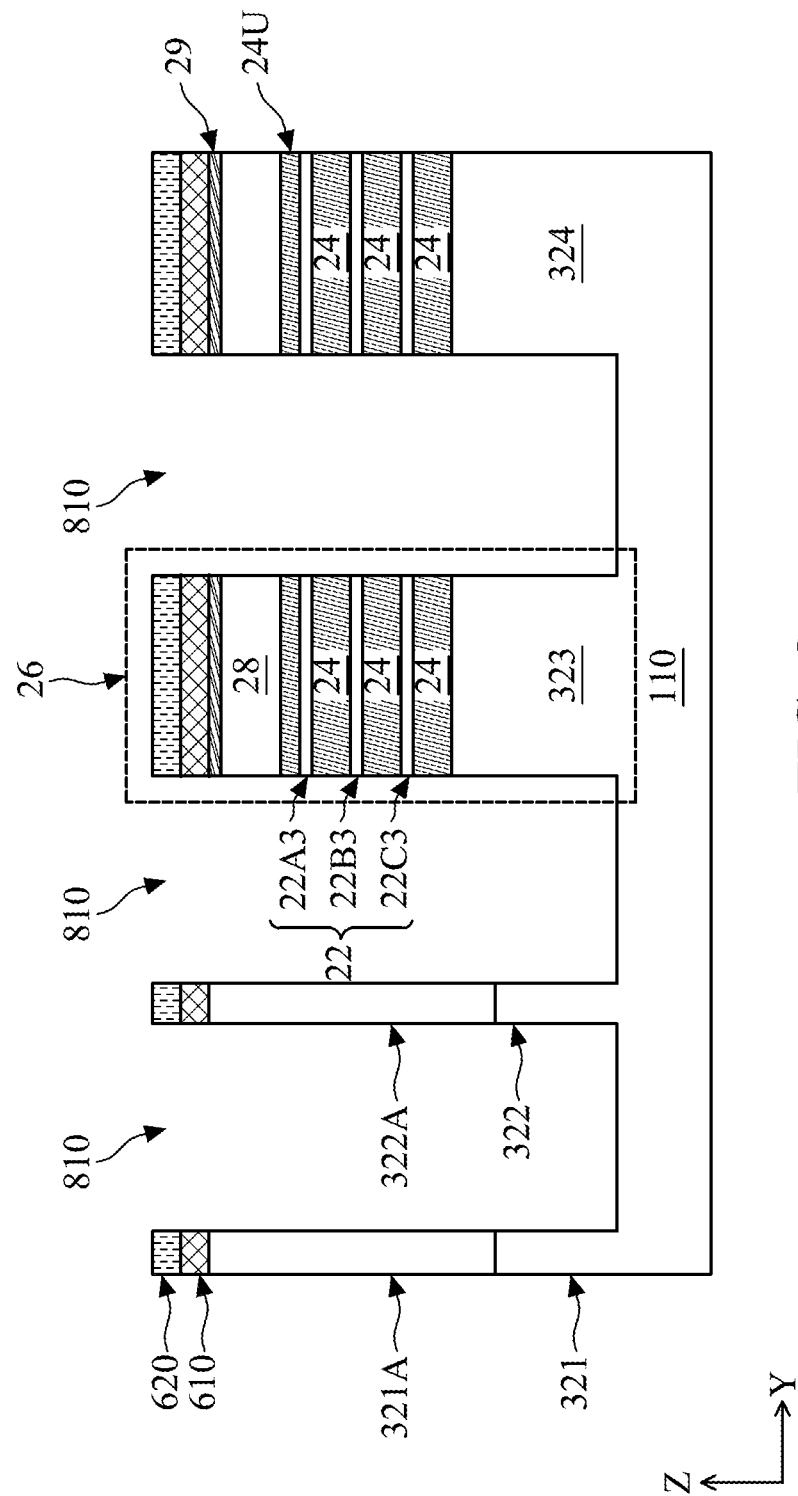

In FIG. 8, following formation of the openings 710 in the one or more mask layers 610, 620, one or more subsequent etching processes is performed to form openings 810 in the fill layer 500, the multilayer stack 25, and underline portions of the substrate 110. Formation of the openings 810 forms the fins 321, 322 in the substrate 110 and the fill layer 500, including upper portions 321A, 322A of the fins 321, 322, respectively. Formation of the openings 810 further forms the nanostructures 22, 24 of fin stacks 26. In some embodiments, a visible interface is present between the upper portions 321A, 322A and the remaining portions of the fins 321, 322.

In FIG. 8, the fins 321-324 are formed in the substrate 110 and the nanostructures 22, 24 are formed in the multi-layer stack 25 corresponding to operations 1400, 1500 of FIG. 36.

In some embodiments, the nanostructures 22, 24 and the fins 321-324 may be formed by etching trenches in the multilayer stack 25 and the substrate 110. The etching may be any acceptable etch process, such as a reactive ion etch (RIE), neutral beam etch (NBE), the like, or a combination thereof. The etching may be anisotropic. First nanostructures 22A3-22C4 (also referred to as "channels") are formed from the first semiconductor layers 21, and second nanostructures 24 are formed from the second semiconductor layers 23. Distance between adjacent fins 321-324 and nanostructures 22, 24 in the Y-direction may be from about 18 nm to about 100 nm.

The fins 321-324 and the nanostructures 22, 24 may be patterned by any suitable method. For example, one or more photolithography processes, including double-patterning or multi-patterning processes, may be used to form the fins 321-324 and the nanostructures 22, 24. Generally, double-patterning or multi-patterning processes combine photolithography and self-aligned processes, allowing for pitches smaller than what is otherwise obtainable using a single, direct photolithography process. As an example of one multi-patterning process, a sacrificial layer may be formed over a substrate and patterned using a photolithography process. Spacers are formed alongside the patterned sacrificial layer using a self-aligned process. The sacrificial layer is then removed, and the remaining spacers may then be used to pattern the fins 321-324. In some embodiments, the hard mask layer 29 is patterned, for example by a photolithography process, then the pattern is transferred by an etch process to form the fins 321-324 and the nanostructures 22, 24. Each of the fins 321-324 and its overlying nanostructures 22, 24 may be collectively referred to as a "fin stack." A fin stack 26 including the fin 323 and the nanostructures 22A3, 22B3, 22C3, 24 is outlined by a dashed line in FIG. 8. Two fin stacks 26 are shown in FIG. 8, though few or more than two fin stacks may also be formed by the patterning process.

FIG. 8 illustrates the fins 321-324 having vertically straight sidewalls. In some embodiments, the sidewalls are substantially vertical (non-tapered), such that width of the fins 321-324 and the nanostructures 22, 24 is substantially similar, and each of the nanostructures 22, 24 is rectangular in shape. In some embodiments, the fins 321-324 have tapered sidewalls, such that a width of each of the fins 321-324 and/or the nanostructures 22, 24 continuously increases in a direction towards the substrate 110. In such embodiments, each of the nanostructures 22, 24 may have a different width and be trapezoidal in shape.

Figure 9:
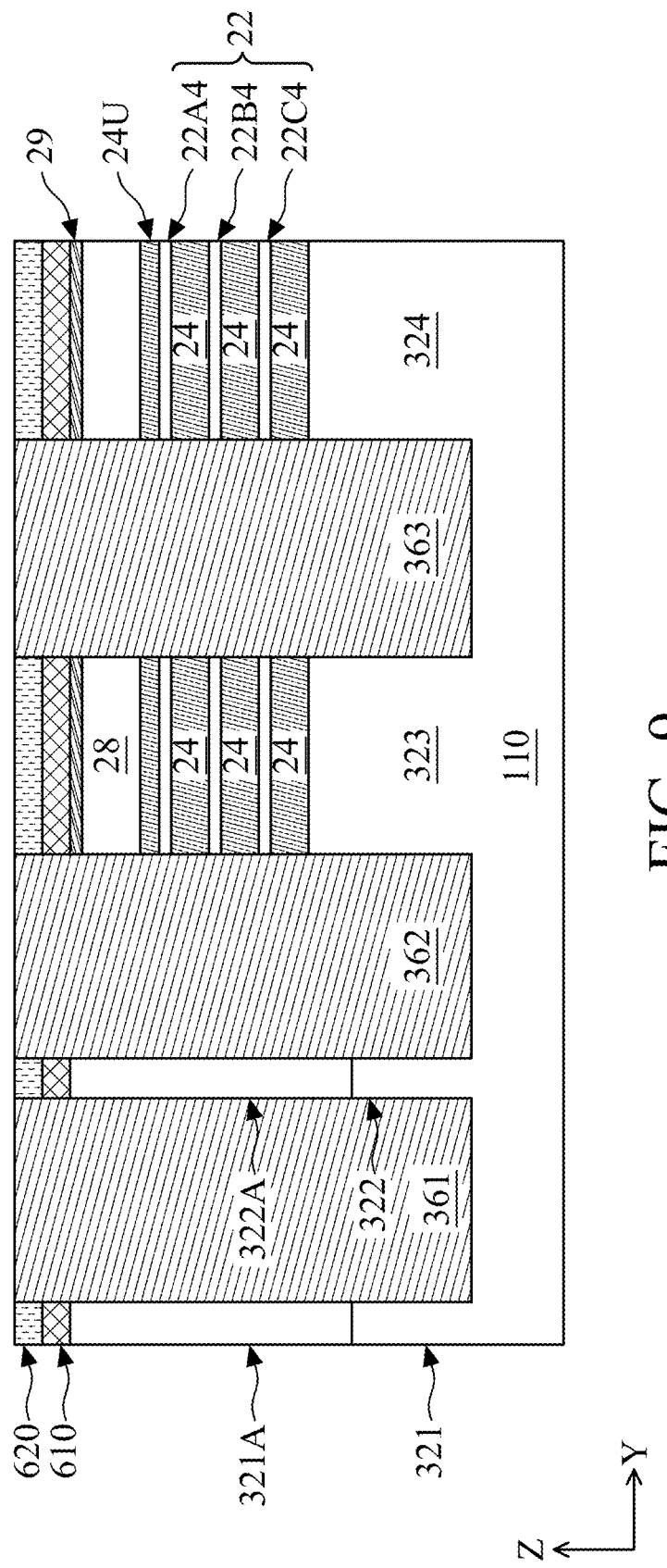

In FIG. 9, following formation of the openings 810, the isolation regions 361, 362, 363 are formed in the openings 810 by deposition of one or more appropriate materials, such as silicon oxide, corresponding to operation 1600 of FIG. 36. Excess material over the mask layer 620 may be removed, for example, by a CMP procedure or other appropriate method. In FIG. 9, the isolation regions 361-363, which may be shallow trench isolation (STI) regions, are formed adjacent and between the fins 321-324. The isolation regions 361-363 may be formed by depositing an insulation material over the substrate 110, the fins 321-324, and nanostructures 22, 24, and between adjacent fins 321-324 and nanostructures 22, 24. The insulation material may be an oxide, such as silicon oxide, a nitride, the like, or a combination thereof, and may be formed by high-density plasma CVD (HDP-CVD), flowable CVD (FCVD), the like, or a combination thereof. In some embodiments, a liner (not separately illustrated) may first be formed along surfaces of the substrate 110, the fins 321-324, and the nanostructures 22, 24. Thereafter, a fill material, such as those discussed above may be formed over the liner.

Figure 10:
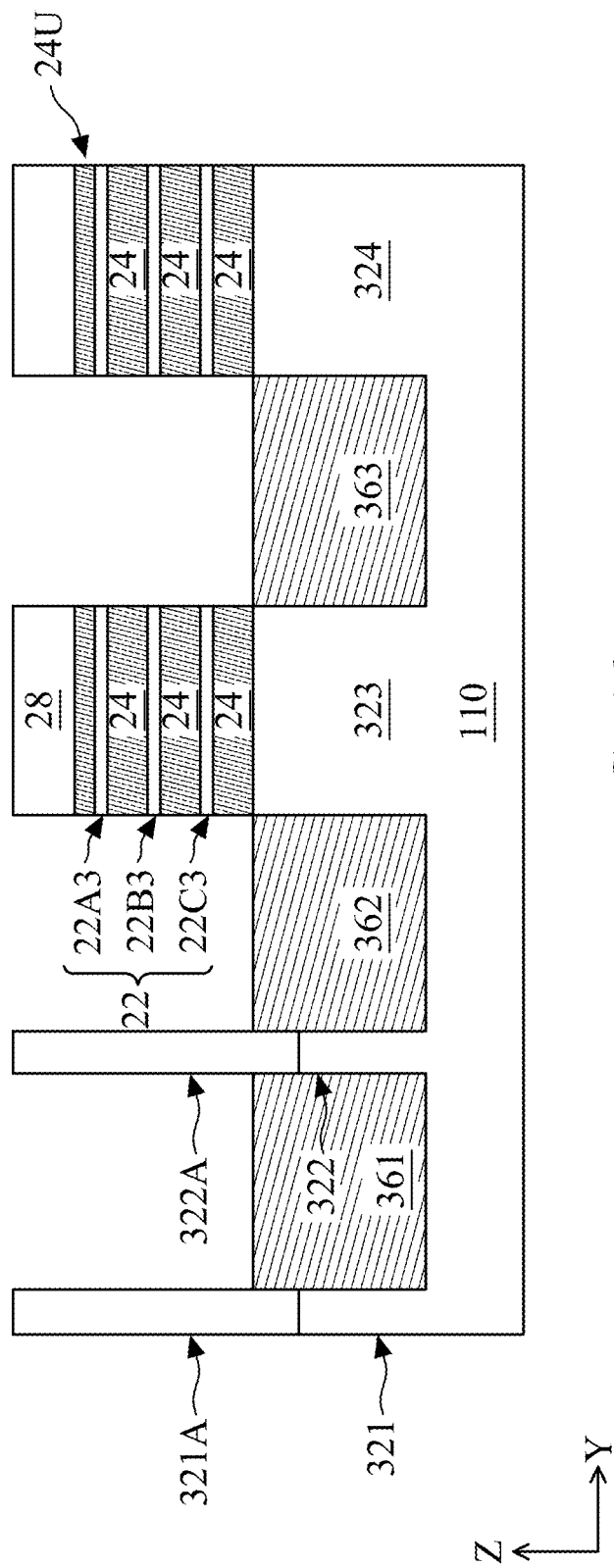

In FIG. 10, following formation of the isolation regions 361, 362, 363 in the openings 810, the isolation regions 361, 362, 363 are recessed (e.g., in the Z direction) to a level at or near upper surfaces of the fins 323, 324. In some embodiments, prior to recessing the isolation regions 361, 362, 363, a removal operation may be performed, such as a CMP, to remove the mask layers 610, 620 and the hard mask layer 29, as well as portions of the isolation regions 361, 362, 363 above the buffer layer 28. Following the CMP, the recessing may include an etch operation selective to the isolation regions 361, 362, 363. In some embodiments, following the etch operation, upper surfaces of the isolation regions 361, 362, 363 may be substantially level, as shown, or may be convex or concave. In some embodiments, the isolation regions 361-363 are recessed by an acceptable etching process, such as an oxide removal using, for example, dilute hydrofluoric acid (dHF), which is selective to the insulation material and leaves the fins 321-324 and the nanostructures 22, 24 substantially unaltered.

FIGS. 2 through 10 illustrate one embodiment (e.g., etch last) of forming the fins 321-324 and the nanostructures 22, 24. In some embodiments, the fins 321-324 and/or the nanostructures 22, 24 are epitaxially grown in trenches in a dielectric layer (e.g., etch first). The epitaxial structures may comprise the alternating semiconductor materials discussed above, such as the first semiconductor materials and the second semiconductor materials. In such embodiments, formation of the opening 400 and the fill layer 500 in the opening 400 may be omitted, such that the fins 321, 322 are formed directly in the substrate 110. Generally, the operations shown in FIGS. 2-10 may provide advantages over embodiments in which the epitaxial structures are grown in trenches neighboring regions in which the fins 321, 322 are to be formed. For example, when growing the multilayer stack 25 in a trench, the first semiconductor layers 21 and the second semiconductor layers 22 may be epitaxially grown on sidewalls of the trench in addition to the bottom of the trench. As such, a thick epitaxial layer may be present between the multilayer stack 25 and the region in which the fins 321, 322 are to be formed. Removal of the thick epitaxial layer may involve additional process steps that add cost and complexity to formation of the convergent structure shown, for example, in FIG. 8.

Further in FIG. 10, appropriate wells (not separately illustrated) may be formed in the fins 321-324, the nanostructures 22, 24, and/or the isolation regions 361-363. Using masks, an n-type impurity implant may be performed in p-type regions of the substrate 110, and a p-type impurity implant may be performed in n-type regions of the substrate 110. Example n-type impurities may include phosphorus, arsenic, antimony, or the like. Example p-type impurities may include boron, boron fluoride, indium, or the like. An anneal may be performed after the implants to repair implant damage and to activate the p-type and/or n-type impurities. In some embodiments, in situ doping during epitaxial growth of the fins 321-324 and the nanostructures 22, 24 may obviate separate implantations, although in situ and implantation doping may be used together.

Figure 11:
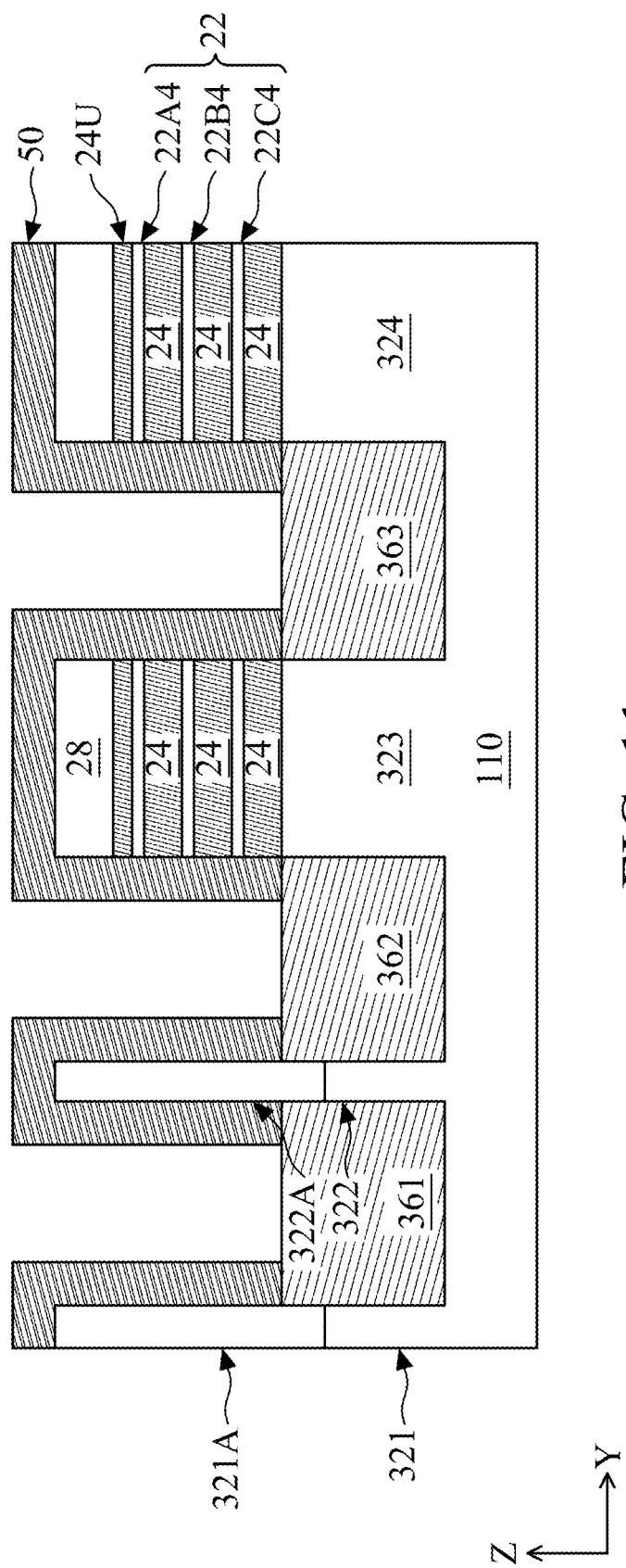

In FIG. 11, a cladding layer 50 is formed over and around the nanostructures 22, 24, upper portions of the fins 321-324, and peripheral portions of the isolation regions 361-364. The cladding layer 50 may be formed of a semiconductor material (such as one selected from the candidate semiconductor materials of the substrate 50), which may be grown by a process such as vapor phase epitaxy (VPE) or molecular beam epitaxy (MBE), deposited by a process such as chemical vapor deposition (CVD) or atomic layer deposition (ALD), or the like. In some embodiments, the cladding layer 50 comprises SiGe. The isolation regions 361-363 may be exposed by performing an anisotropic etch after depositing the material of the cladding layer 50. Generally, as the cladding layer 50 is a temporary structure that will be removed with the nanostructures 24 prior to formation of the gate structures 200A-200D, the cladding layer 50 may comprise the same material as the nanostructures 24. In some embodiments, thickness of the cladding layer 50 may be in a range of about 9 nm to about 15 nm.

Figure 12:
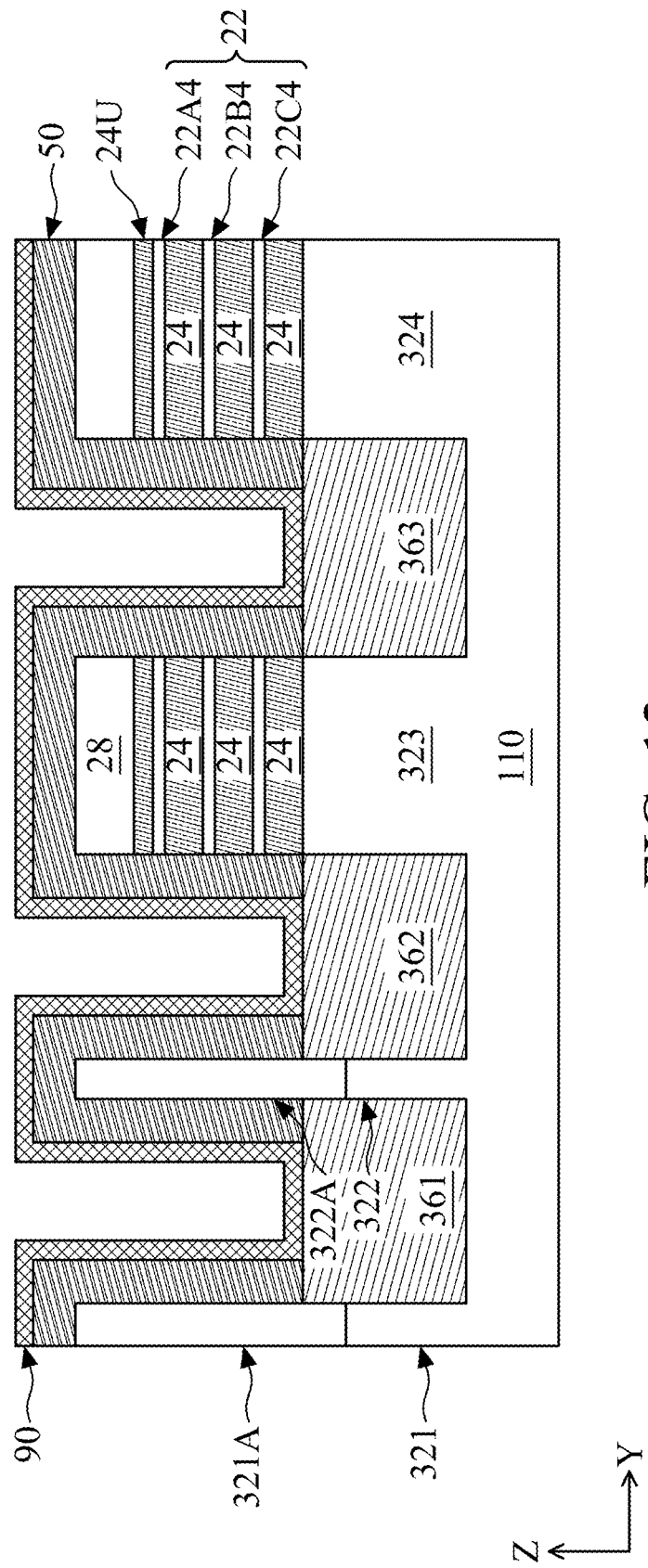
Figure 13:
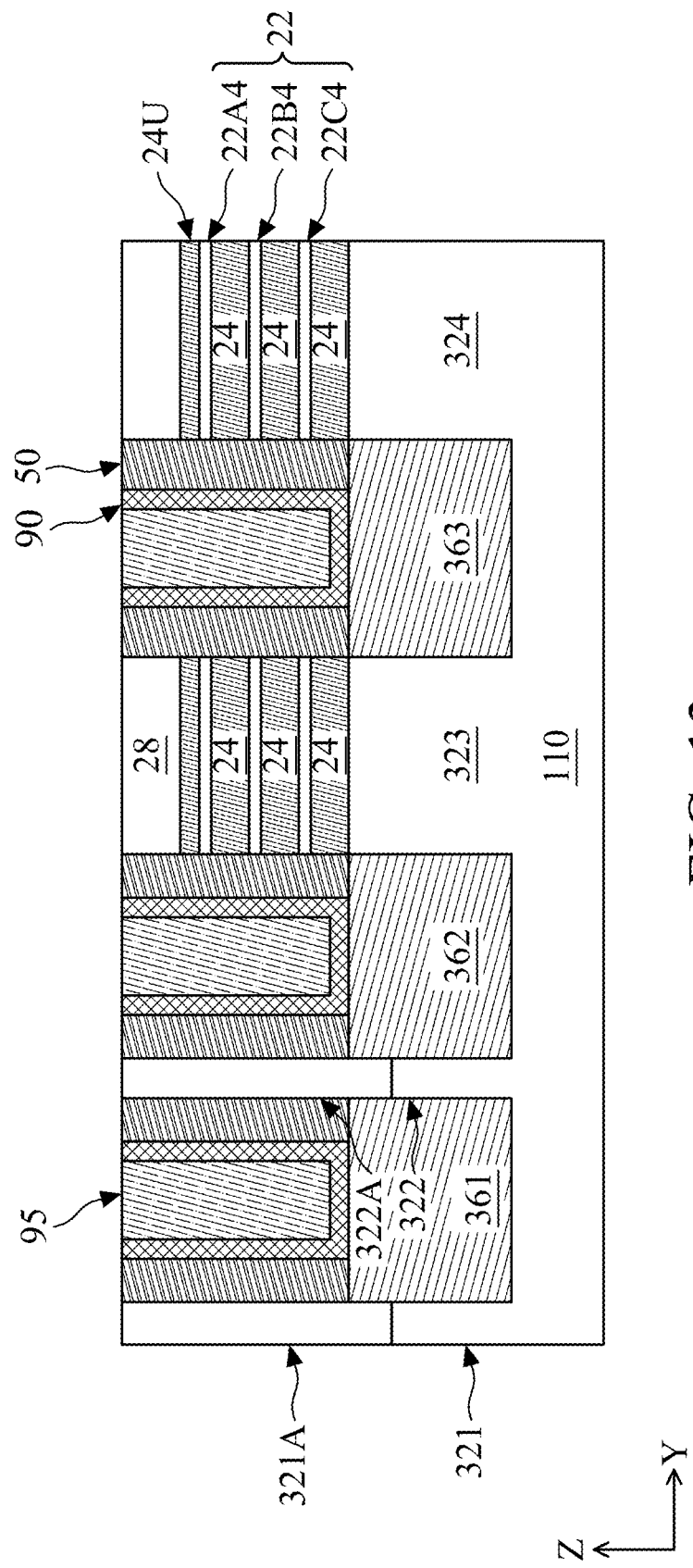
Figure 14:
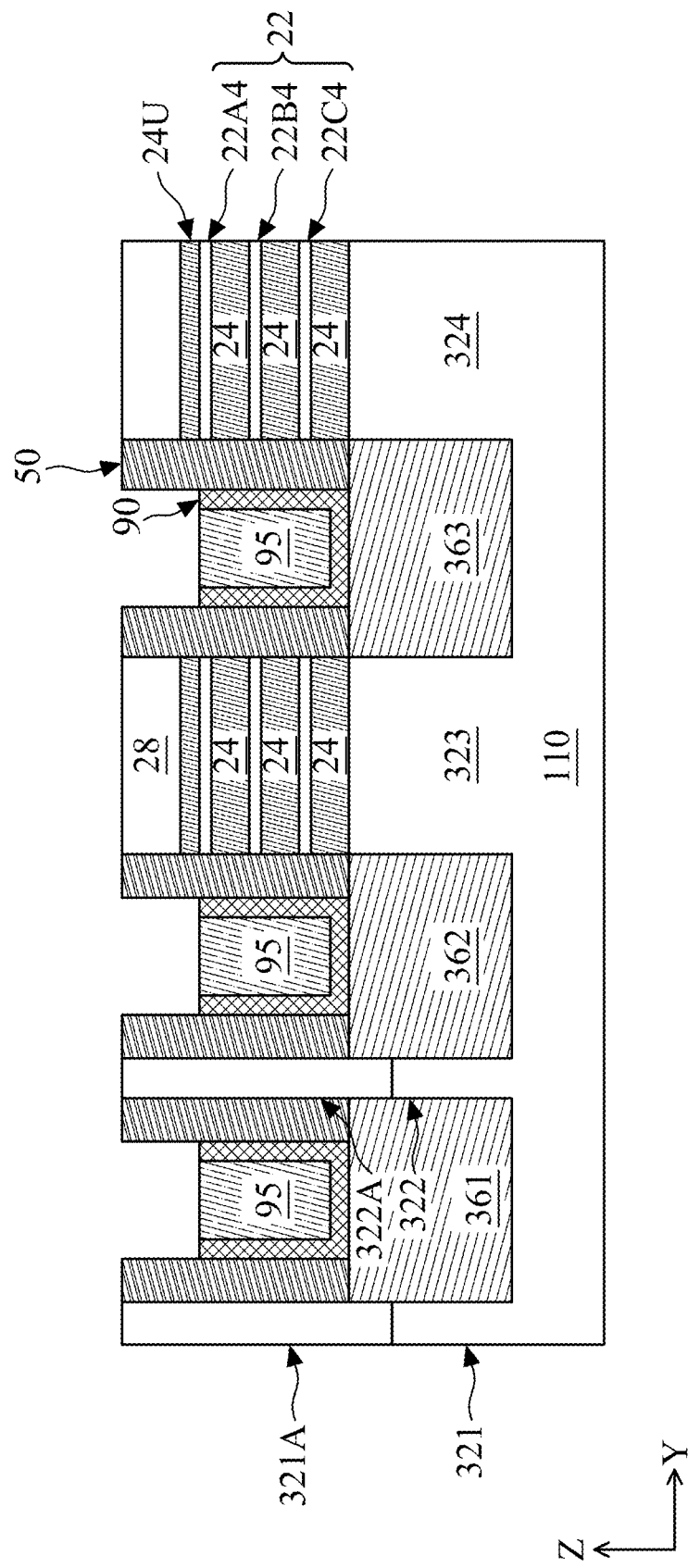

FIGS. 12-14 illustrate formation of the inactive fins 94, corresponding to operation 1700 of FIG. 36. In FIG. 12, a dielectric layer 90 used for forming the inactive fins 94 is formed between the cladding layer 50 and on the isolation regions 361-363. The dielectric layer 90 may be formed of a low-k dielectric material (such as one selected from the candidate dielectric materials of the inactive fins 94). The dielectric layer 90 can have a thickness in the range of about 6 nm to about 30 nm. As shown in FIG. 12, formation of the dielectric layer 90 over the isolation regions 361-363 is by a self-aligned process using the cladding layer 50. The self-aligned process allows for spacing between the respective fins 321-324 to be closer than would be possible if the dielectric layer 90 used for forming the inactive fins 94 were deposited in typical processes. In a typical process, the dielectric layer 90 would be deposited after formation and etching of the gate structures 200A-200D. Due to process constraints, particularly overlap/alignment rules, etching the gate structures 200A-200D, sometimes referred to as a "cut gate" process, requires a relatively large spacing between the fins 321-324, so as not to etch too close to the nanostructures 22 on either side of an opening formed by the etching. By depositing the dielectric layer 90 in the openings between vertical portions of the cladding layer 50 on sidewalls of the nanostructures 22, 24, not only is alignment ensured, but the spacing can be reduced, which allows for design and fabrication of smaller area circuit functional blocks with the same or better performance.

In FIG. 13, an oxide layer 95 is formed over the isolation structures 361-363, between sidewalls and over an upper surface of the portion of the dielectric layer 90 overlying the isolation region 361-363. In some embodiments, the oxide layer 95 comprises silicon oxide.

In FIG. 14, a removal process is performed to recess excess material of the cladding layer 50, the dielectric layer 90, and the oxide layer 95 to a level substantially coplanar with the top surface of the buffer layer 28. The removal process may be a CMP process, in some embodiments, which forms the inactive fins 94. In some embodiments, the removal process further recesses the dielectric layer 90 and the oxide layer 95 to a level at or near top surfaces of the nanostructures 22A3, 22A4.

Figure 15:
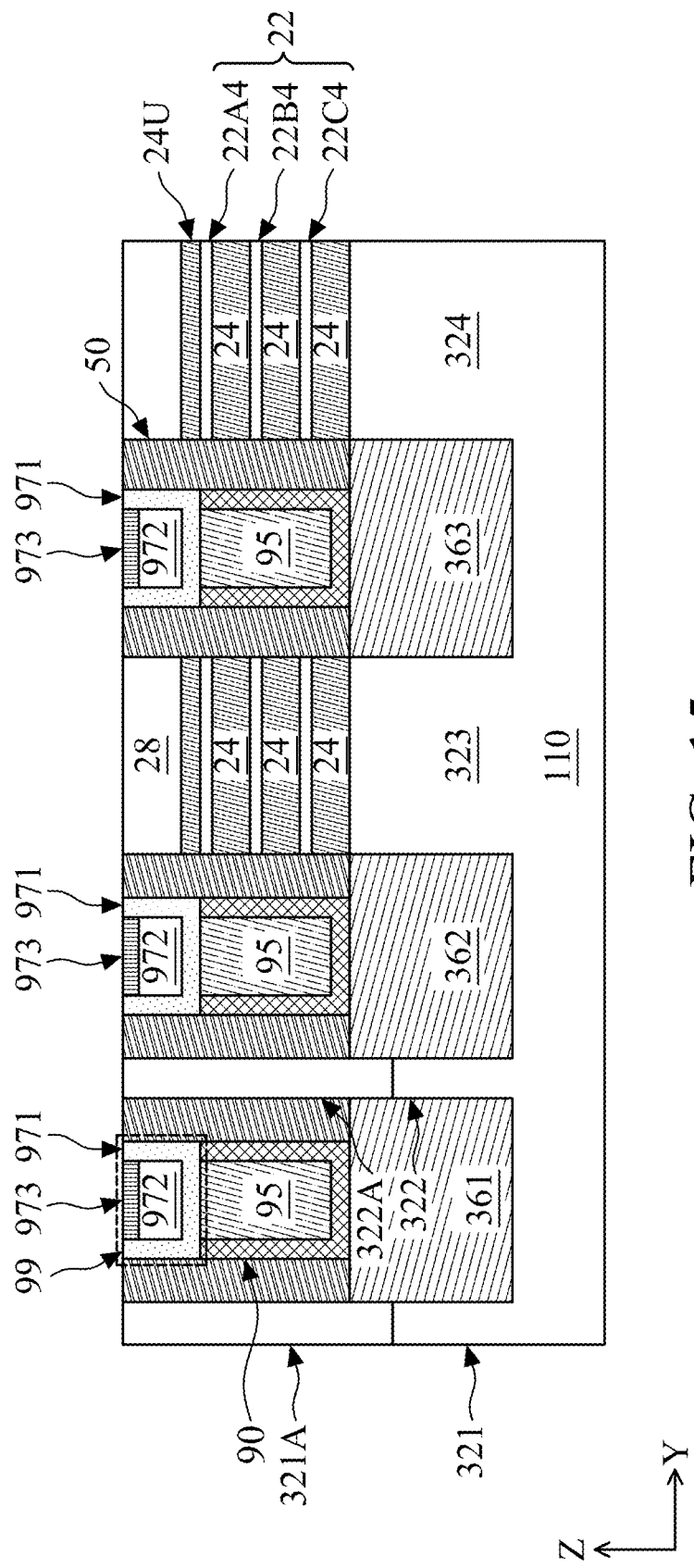

In FIG. 15, following recessing of the inactive fins 94, the gate isolation structures 99 are formed overlying the inactive fins 94, corresponding to operation 1700 of FIG. 36. In some embodiments, the gate isolation structures 99 include one or more of a liner layer 971, a fill layer 972 and a cap layer 973. The liner layer 971 may include a first material, which may be a high-k dielectric material, and may be formed by a suitable deposition operation, such as CVD, ALD, or the like. The fill layer 972 may include a second material having a lower dielectric constant than the first material, such as a low-k dielectric material, and may be formed by a suitable deposition operation, such as CVD, ALD, or the like.

Following formation of the fill layer 972, the fill layer 972 may be planarized by a CMP operation to be level with the upper surface of the buffer layer 28, then the fill layer 972 may be recessed to a level somewhat below the upper surface of the buffer layer 28. After recessing the fill layer 972, the cap layer 973 may be formed over the fill layer 972, and another CMP operation may be performed to remove excess material of the cap layer 973 from over the buffer layer 28, the cladding layer 50 and the liner layer 971.

Figure 16:
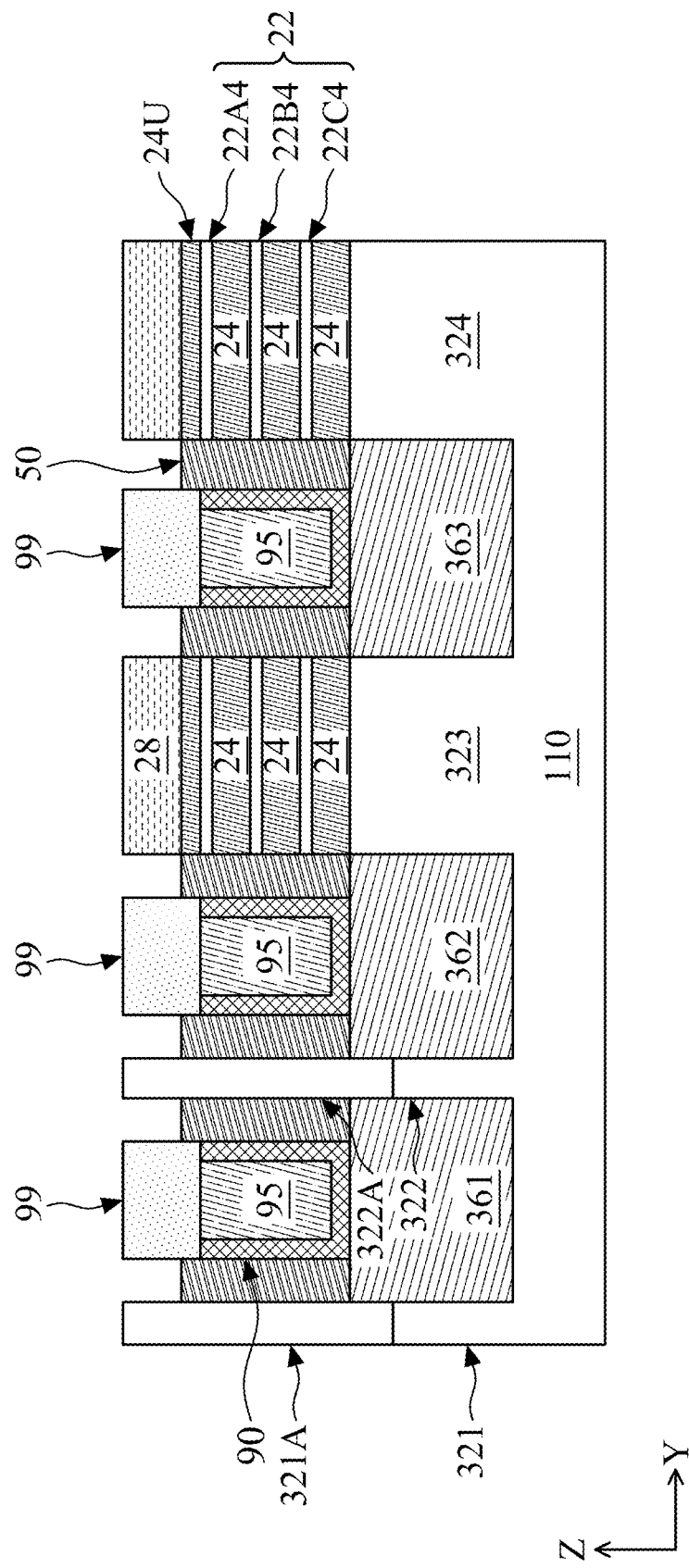

In some embodiments, the liner layer 971 may have thickness in a range of about 1 nm to about 6 nm. Height of the liner layer 971 (in the Z direction) above the upper surface of the nanostructures 22A3, 22A4 may be in a range of about 15 nm to about 25 nm. Width of the fill layer 972 may be in a range of about 8 nm to about 30 nm. In some embodiments, thickness of the cap layer 973 may be in a range of about 1 nm to about 6 nm, which may be similar to the thickness of the liner layer 971. In some embodiments, the thickness of the cap layer 973 is different from the thickness of the liner layer 971. In some embodiments, the fill layer 972 and the cap layer 973 are not present, such that the gate isolation structures 99 include only the liner layer 971, which is shown in FIG. 16 and subsequent figures. Inclusion of the low-k dielectric fill layer 972 reduces capacitance induced by the gate isolation structures 99 at the cost of increased process complexity. In some configurations, a simpler process that only includes the high-k dielectric liner layer 971 may be acceptable.

In FIG. 16, the cladding layer 50 is recessed to a level at or near the top surface of the upper nanostructure 24U to prepare for recessing of the buffer layer 28. In some embodiments, recessing of the cladding layer 50 is by an etching operation, which may be selective to material (e.g., SiGe) of the cladding layer 50.

Figure 17:
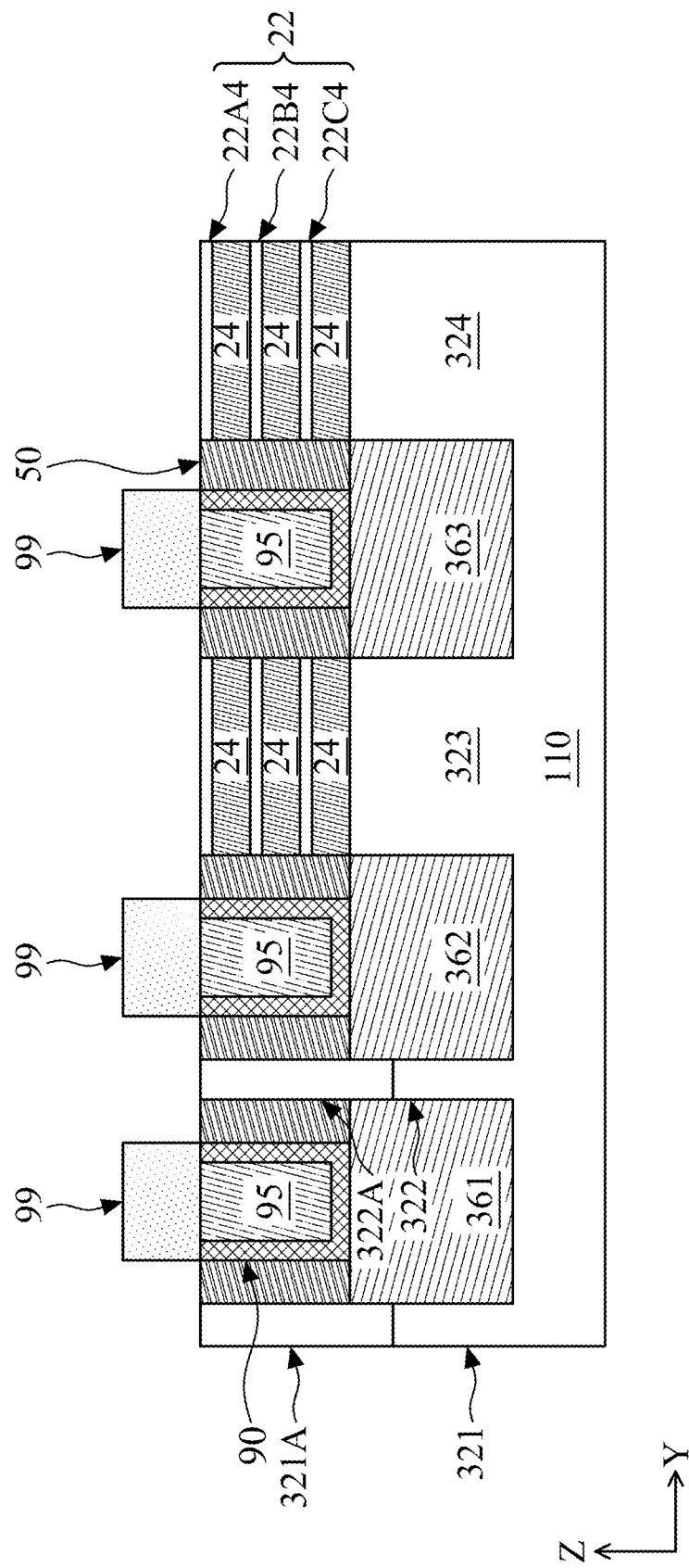

In FIG. 17, following recessing of the cladding layer 50, the buffer layer 28, the upper nanostructure 24U, and portions of the cladding layer 50 and the fins 321, 322 above the topmost nanostructures 22A3, 22A4 are removed. In some embodiments, one or more etching operations may be performed to complete the recessing.

Figure 18:
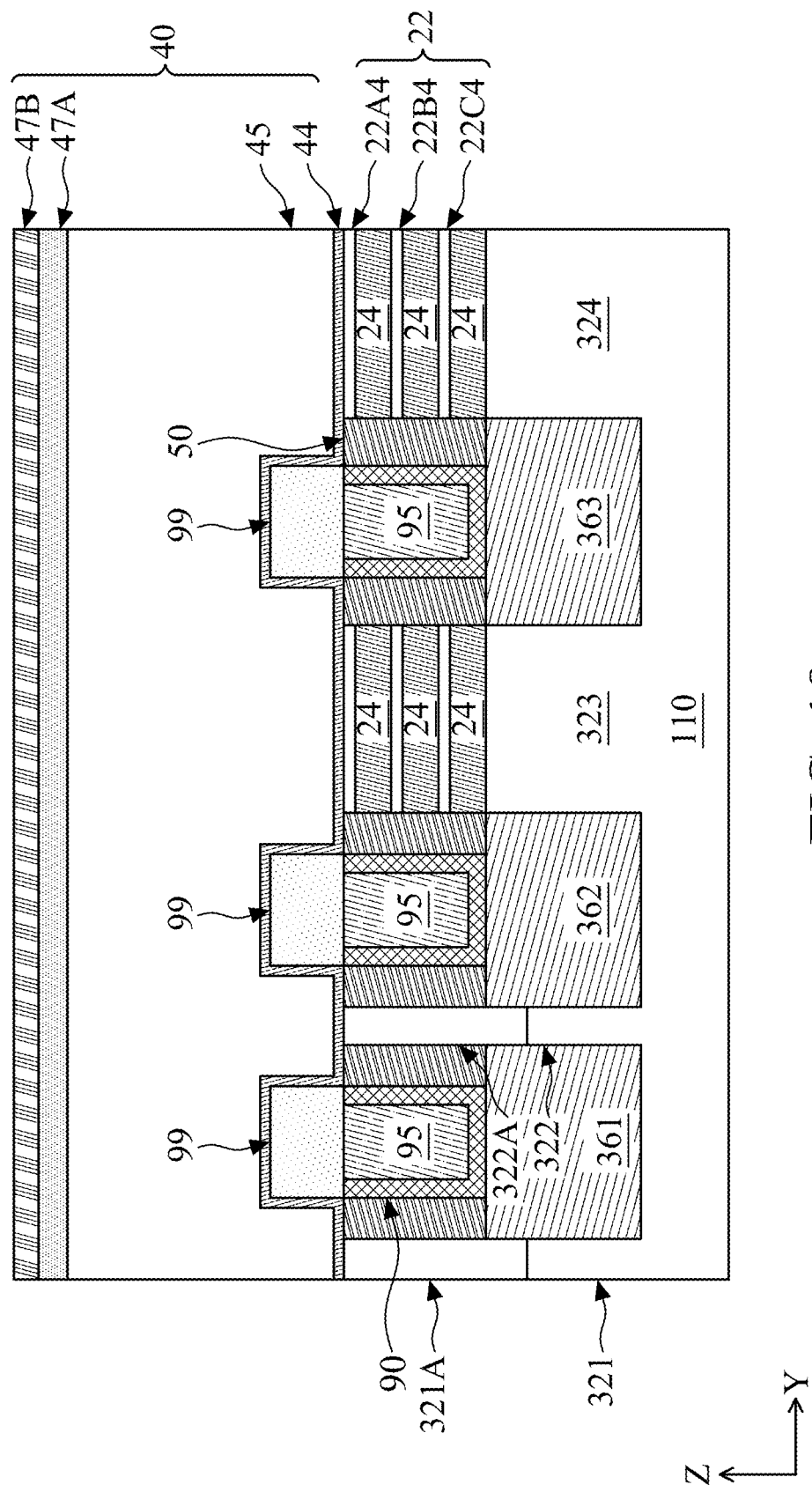

FIG. 18 is a perspective view of an intermediate stage of formation of the IC device 10 in accordance with various embodiments. Following recessing of the cladding layer 50, the buffer layer 28, the upper nanostructure 24U, and portions of the cladding layer 50 and the fins 321, 322, dummy gate structures 40 are formed over the fins 321-324, the gate isolation structures 99 and/or the nanostructures 22, 24. A single dummy (or "sacrificial") gate structure 40 is shown in FIG. 18, and many further dummy gate structures 40 may be formed substantially parallel and concurrently with the dummy gate structure 40 shown. In forming the dummy gate structure 40, a dummy gate layer 45 is formed over the fins 321-324 and/or the nanostructures 22, 24. The dummy gate layer 45 may be made of materials that have a high etching selectivity to the isolation regions 361-363. The dummy gate layer 45 may be a conductive, semiconductive, or non-conductive material and may include amorphous silicon, polycrystalline-silicon (polysilicon), poly-crystalline silicon-germanium (poly-SiGe), metallic nitrides, metallic silicides, metallic oxides, metals, or another suitable material. The dummy gate layer 45 may be deposited by physical vapor deposition (PVD), CVD, sputter deposition, or other techniques for depositing the selected material. A mask layer 47, which may include a lower mask layer 47A and an upper mask layer 47B, is formed over the dummy gate layer 45, and may include, for example, silicon nitride, silicon oxynitride, or the like. In some embodiments, a gate dielectric layer 44 is formed before the dummy gate layer 45 between the dummy gate layer 45 and the fins 321-324 and/or the nanostructures 22, 24. The gate dielectric layer 44 may further be formed on the upper surface and lateral sidewalls of the gate isolation structures 99.

Figure 19:
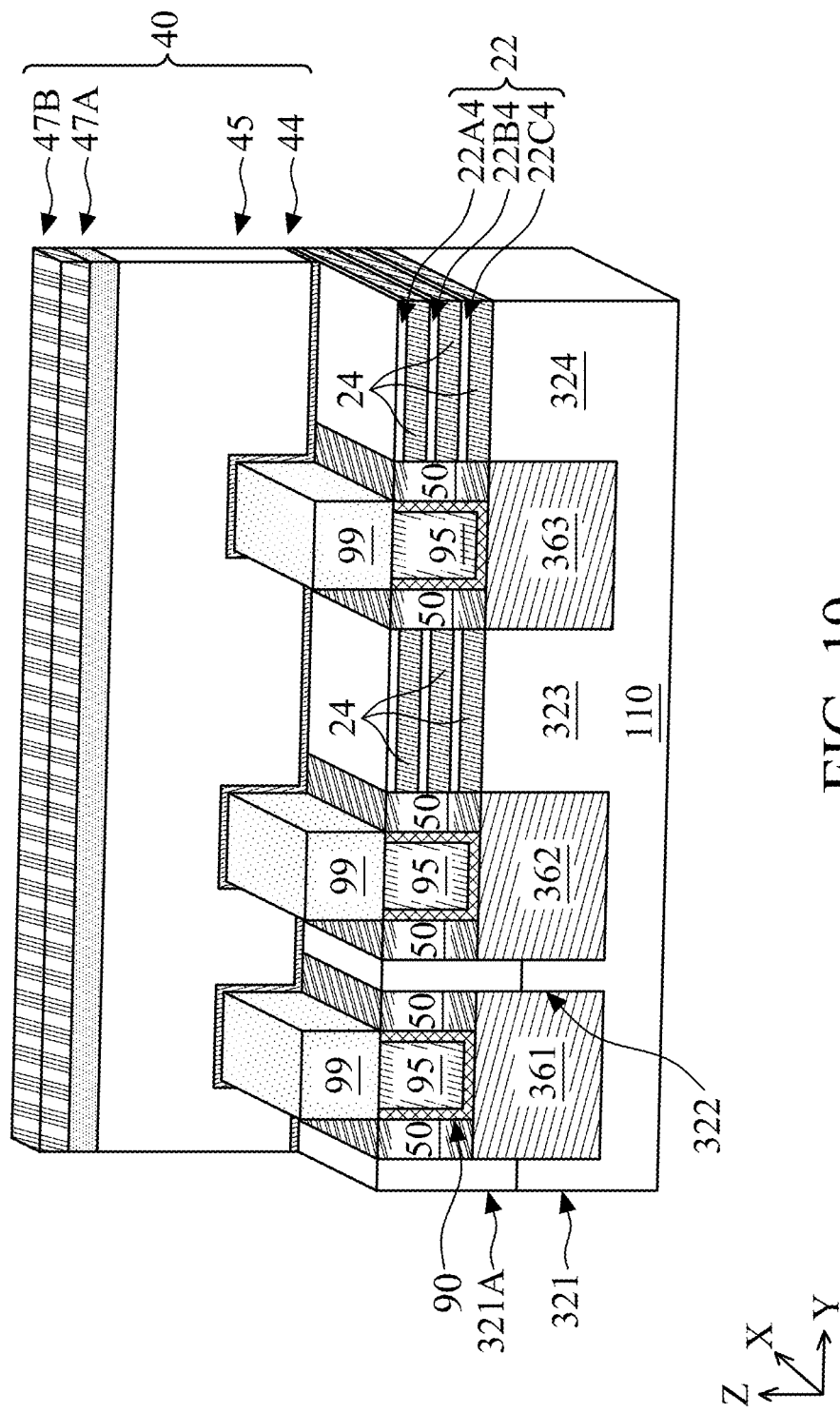

In FIG. 19, the topmost nanostructures 22A3, 22A4, the cladding layer 50, the fins 321, 322 and the gate isolation structures 99 are exposed by removing portions of the gate dielectric layer 44 exposed by the sacrificial gate structure 40. The gate dielectric layer 44 may be removed by an etching operation that is selective to the material of the gate dielectric layer 44.

Figure 20:
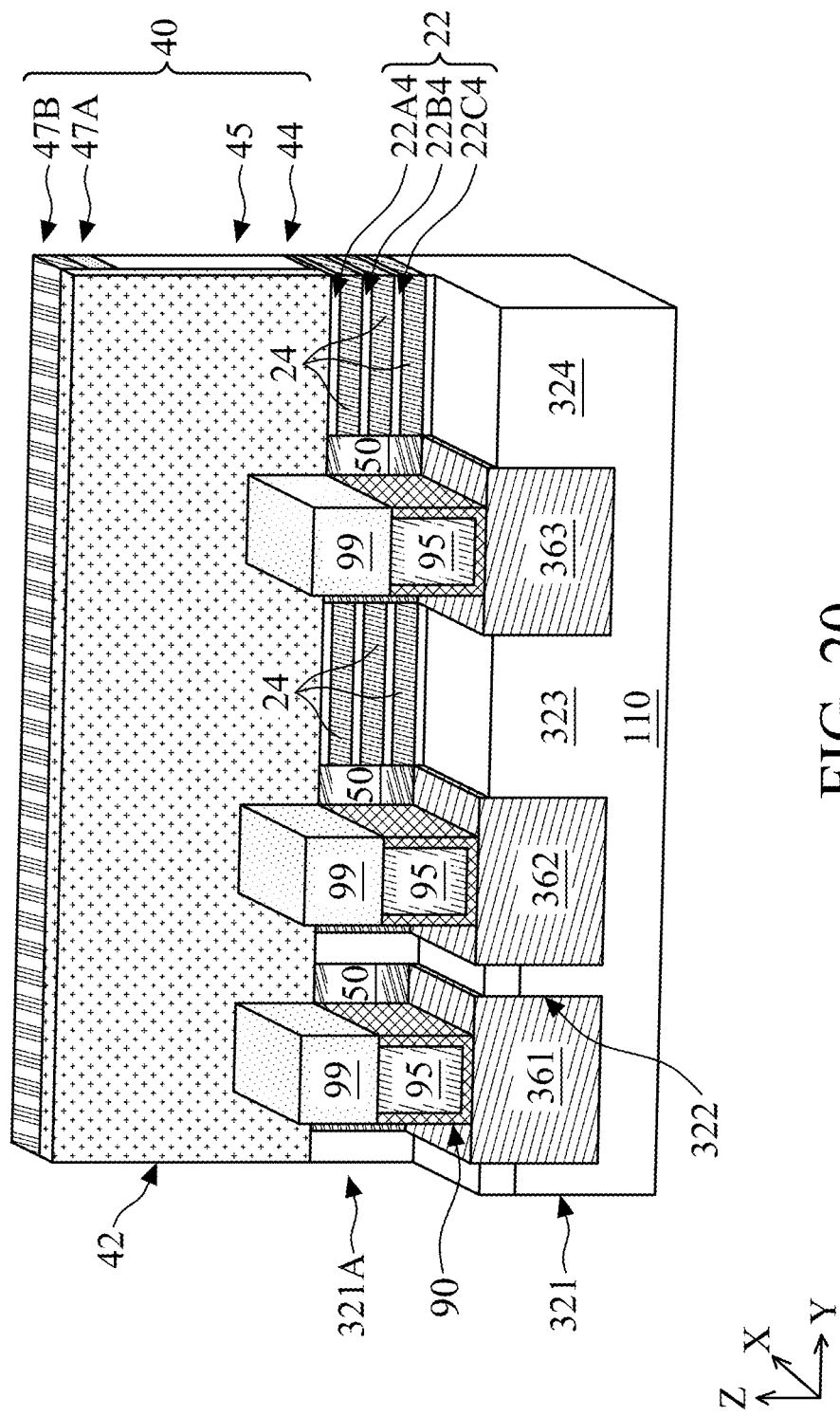

In FIG. 20, the first dielectric layer 42, which is also referred to as "spacer layer 42," is formed over sidewalls of the mask layer 47, the dummy gate layer 45, the gate dielectric layer 44, the hard mask layer 29, the buffer layer 28, the nanostructures 22, 24, the inactive fins 94, and the isolation regions 361-363, e.g., by a conformal deposition process. The spacer layer 42 is made of an insulating material, such as silicon nitride, silicon oxide, silicon carbonitride, silicon oxynitride, silicon oxy carbo-nitride, or the like. Further in FIG. 20, multiple removal processes are performed to remove exposed portions of the cladding layer 50, the nanostructures 22, 24 and the fins 321-324 using the dummy gate structures 40 and the spacer layer 42 as a mask. The cladding layer 50 may be trimmed using an acceptable etching process, such as one that is selective to the cladding layer 50 (e.g., selectively etches the material(s) of the cladding layer 50 at a faster rate than the material(s) of the nanostructures 22, 24 and the gate isolation structures 99).

Figure 21:
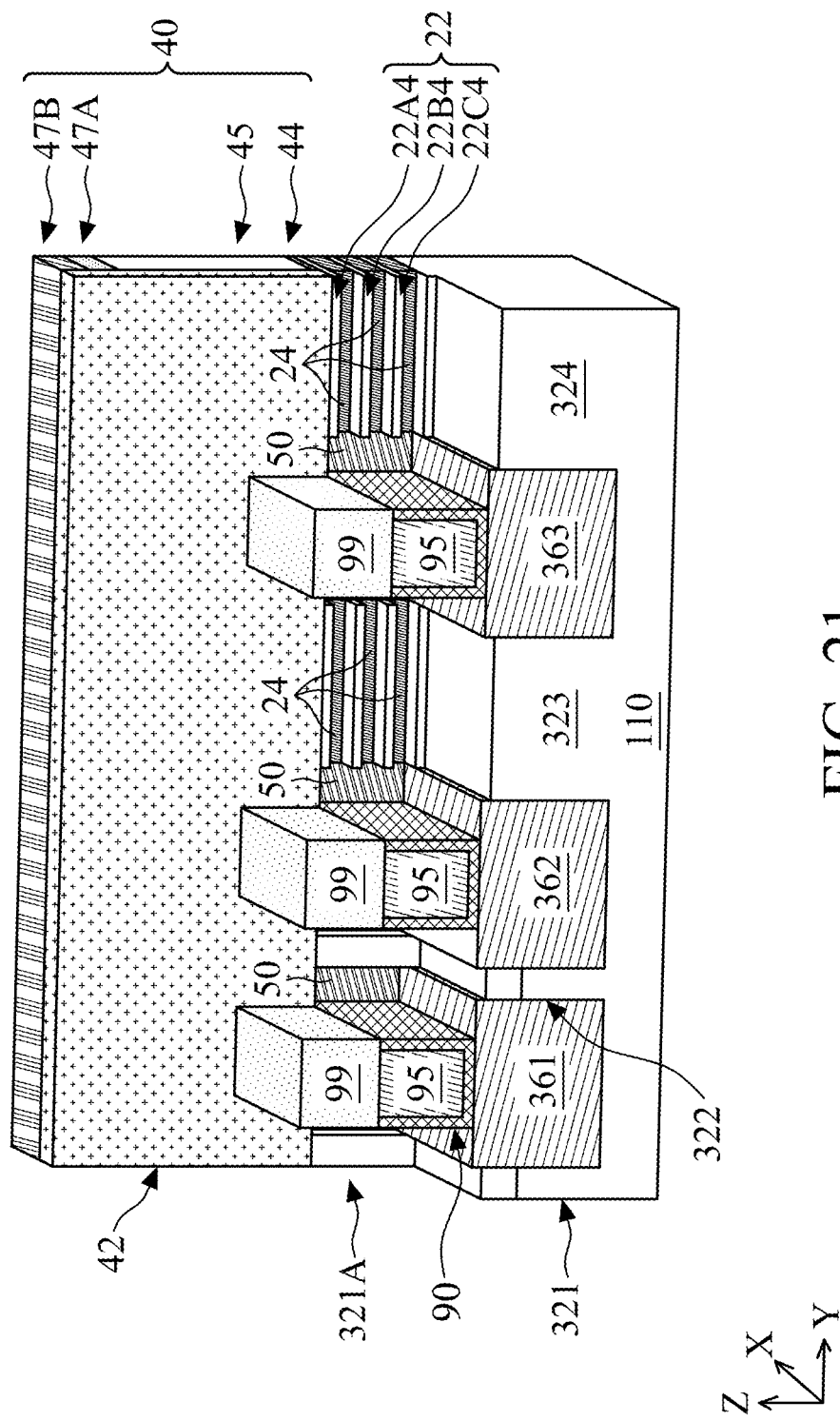
Figure 22:
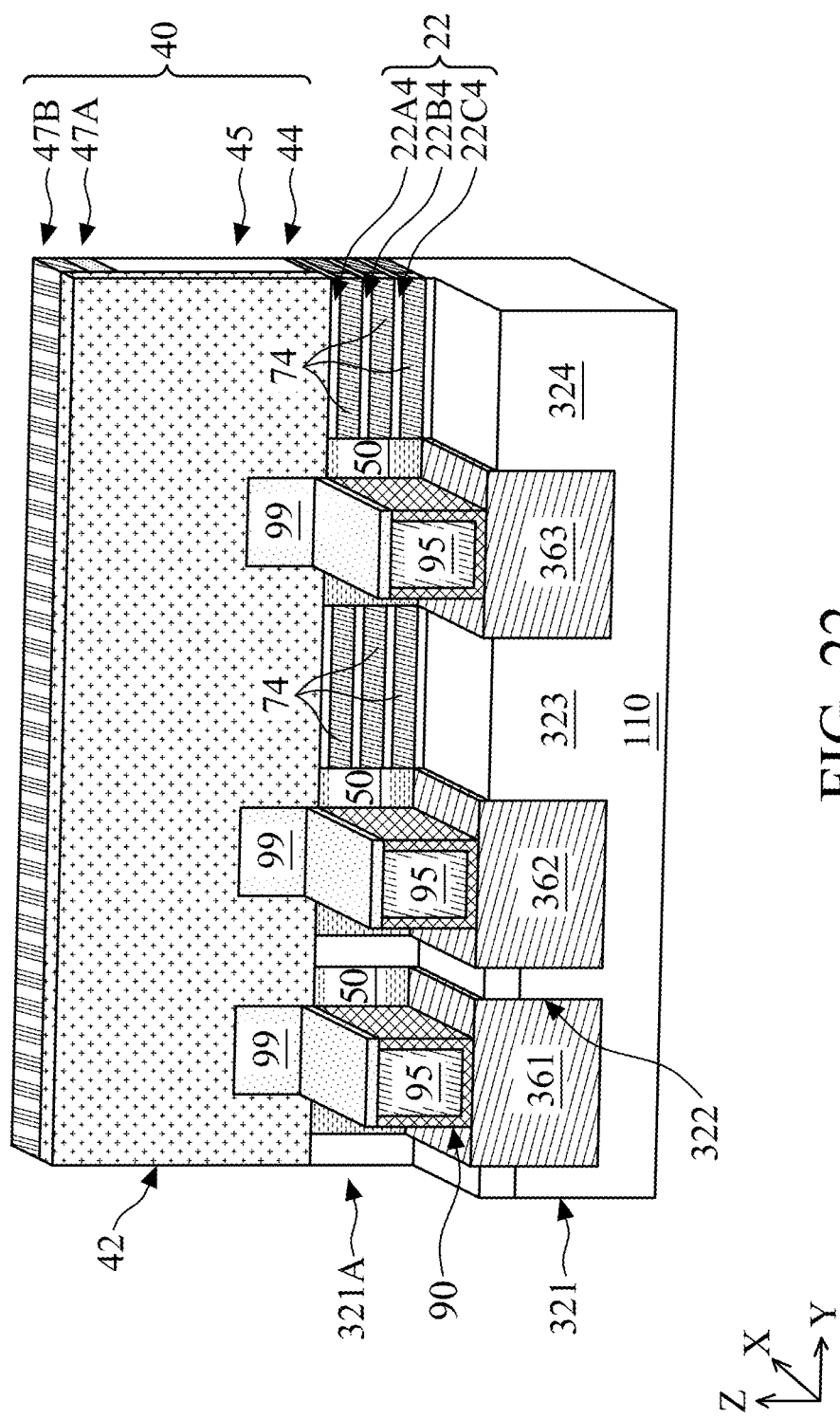

FIGS. 21-22 illustrate formation of inner spacers 74. In FIG. 21, a selective etching process is performed to recess exposed end portions of the nanostructures 24 without substantially attacking the nanostructures 22. After the selective etching process, recesses are formed in the nanostructures 24 at locations where the removed end portions used to be. Next, as shown in FIG. 22, an inner spacer layer is formed to fill the recesses between the nanostructures 22 formed by the previous selective etching process. The inner spacer layer may be a suitable dielectric material, such as silicon carbon nitride (SiCN), silicon oxycarbonitride (SiOCN), or the like, formed by a suitable deposition method such as PVD, CVD, ALD, or the like. An etching process, such as an anisotropic etching process, is performed to remove portions of the inner spacer layers disposed outside the recesses in the nanostructures 24. The remaining portions of the inner spacer layers (e.g., portions disposed inside the recesses in the nanostructures 24) form the inner spacers 74. The resulting structure is shown in FIG. 22.

Further to FIG. 22, portions of the gate isolation structures 99 exposed by the spacer layer 42 are trimmed, leaving remaining thin layers of the gate isolations structures 99 overlying the inactive fins 94. In some embodiments, the thin layers, which may act as capping layers to protect the inactive fins 94, may have thickness of less than about 3 nm, such as about 0.2 nm to about 3 nm. The material of the gate isolation structures 99 is generally harder than the material(s) of the inactive fins 94, which provides structural strength and protection in subsequent processing operations.

Figure 23:
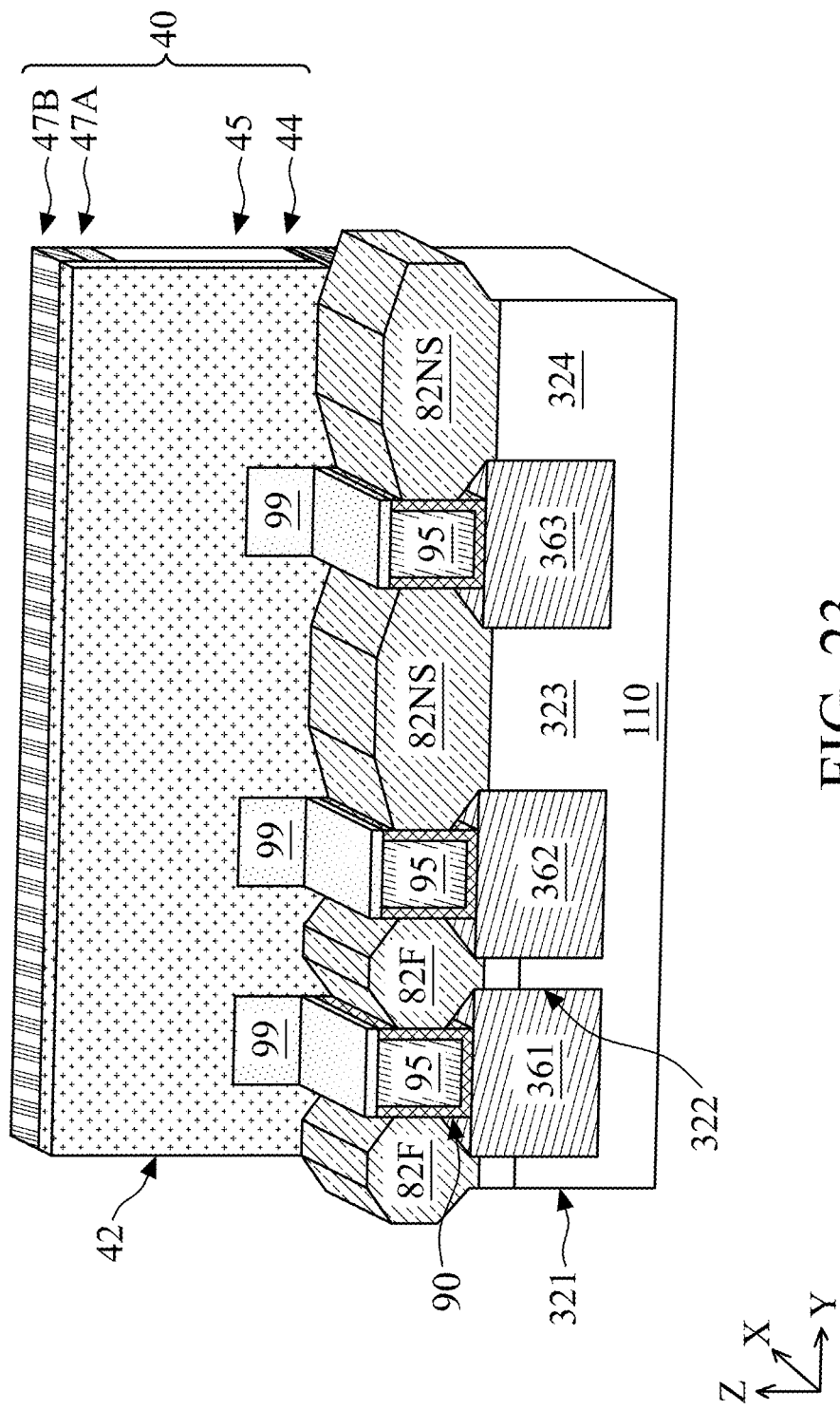

FIG. 23 illustrates formation of the source/drain regions 82 between the inactive fins 94, corresponding to operation 1800 of FIG. 36. In the illustrated embodiment, the source/drain regions 82 are epitaxially grown from epitaxial material(s). In some embodiments, due to reduced spacing between the inactive fins 94 including the dielectric isolation features 90, the source/drain regions 82 are grown substantially without lateral growth. In some embodiments, the source/drain regions 82 exert stress in the respective channels 22A3-22C4, thereby improving performance. The source/drain regions 82 are formed such that each dummy gate structure 40 is disposed between respective neighboring pairs of the source/drain regions 82. In some embodiments, the spacer layer 42 and the inner spacers 74 separate the source/drain regions 82 from the dummy gate layer 45 by an appropriate lateral distance to prevent electrical bridging to subsequently formed gates of the resulting device.

The source/drain regions 82 may include any acceptable material, such as appropriate for n-type or p-type devices. For n-type devices, the source/drain regions 82 include materials exerting a tensile strain in the channel regions, such as silicon, SiC, SiCP, SiP, or the like, in some embodiments. When p-type devices are formed, the source/drain regions 82 include materials exerting a compressive strain in the channel regions, such as SiGe, SiGeB, Ge, GeSn, or the like, in accordance with certain embodiments. The source/drain regions 82 may have surfaces raised from respective surfaces of the fins and may have facets. Neighboring source/drain regions 82 may merge in some embodiments to form a singular source/drain region 82 adjacent two neighboring fins 321-324.

The source/drain regions 82 may be implanted with dopants followed by an anneal. The source/drain regions may have an impurity concentration of between about $10^{19}$ cm$^{-3}$ and about $10^{21}$ cm$^{-3}$. N-type and/or p-type impurities for source/drain regions 82 may be any of the impurities previously discussed. In some embodiments, the source/drain regions 82 are in situ doped during growth. A contact etch stop layer (CESL) and interlayer dielectric (ILD), not illustrated for simplicity, may then be formed covering the dummy gate structures 40 and the source/drain regions 82.

Figure 24:
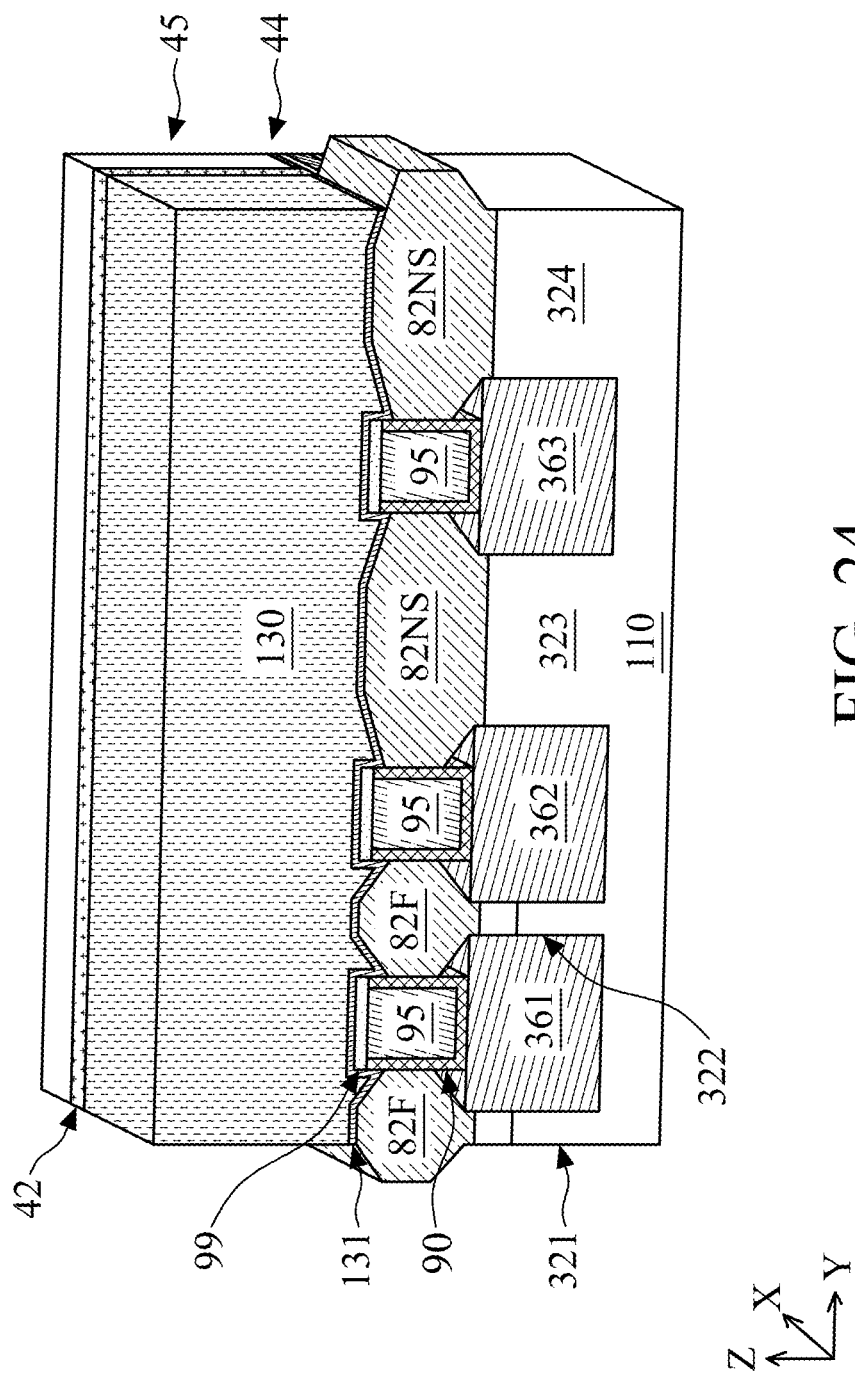
Figure 25:
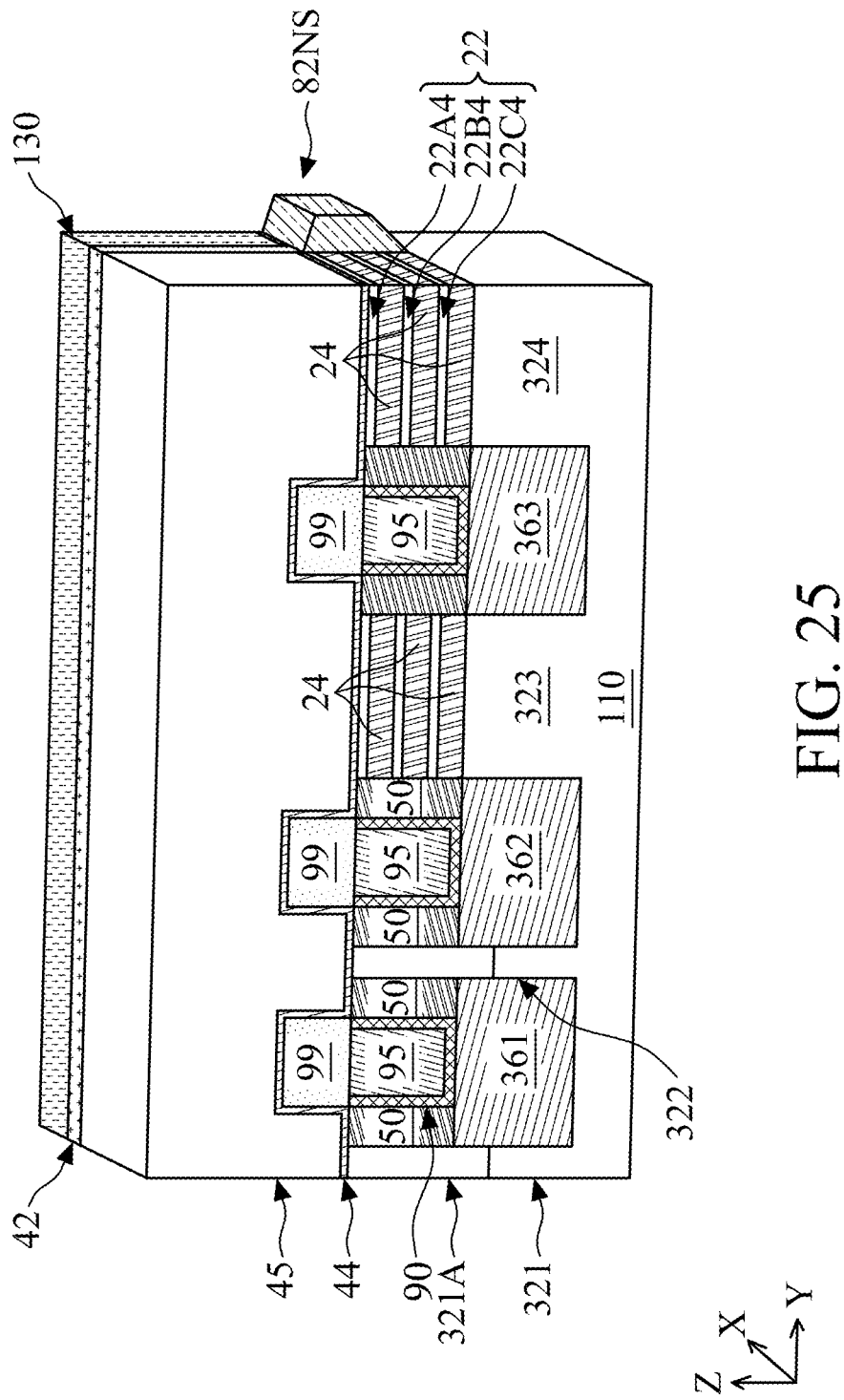

In FIG. 24, the ILD 130 and the etch stop layer 131 are formed over the source/drain regions 82. In some embodiments, the etch stop layer 131 is deposited in a first deposition operation using a first material, such as silicon nitride or another appropriate material. Following deposition of the etch stop layer 131, the ILD 130 is deposited over the etch stop layer 131 in a second deposition operation using a second material, which is different from the first material. Excess material of the ILD 130 following the second deposition operation overlying the sacrificial gate structure 40 and the spacer layer 42 may be removed, for example, by a planarization operation, such as a CMP. FIG. 25 is a perspective cross-sectional view taken through the nanostructures 22, 24 following deposition of the etch stop layer 131 and the ILD 130.

Figure 26:
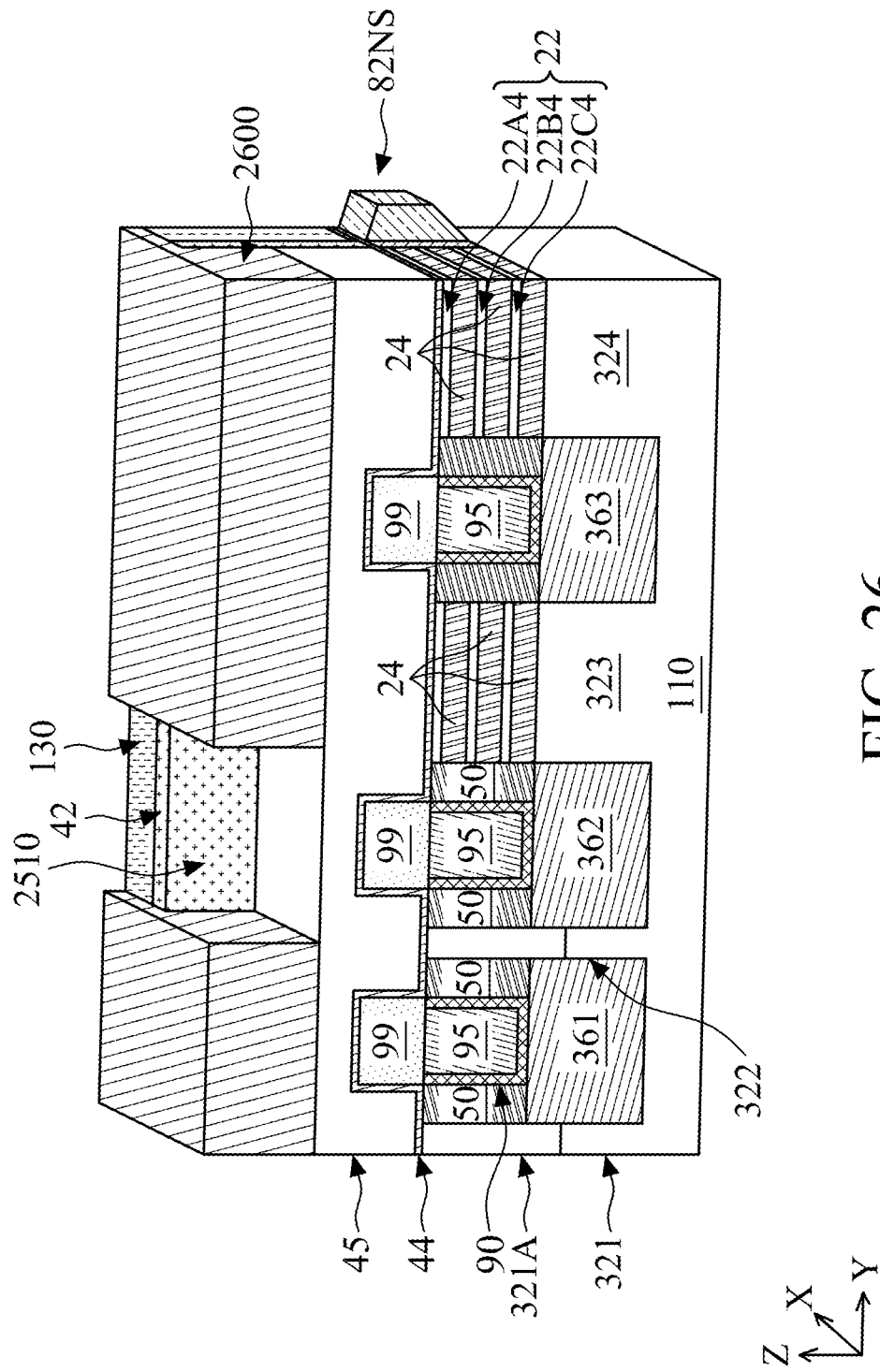
Figure 27:
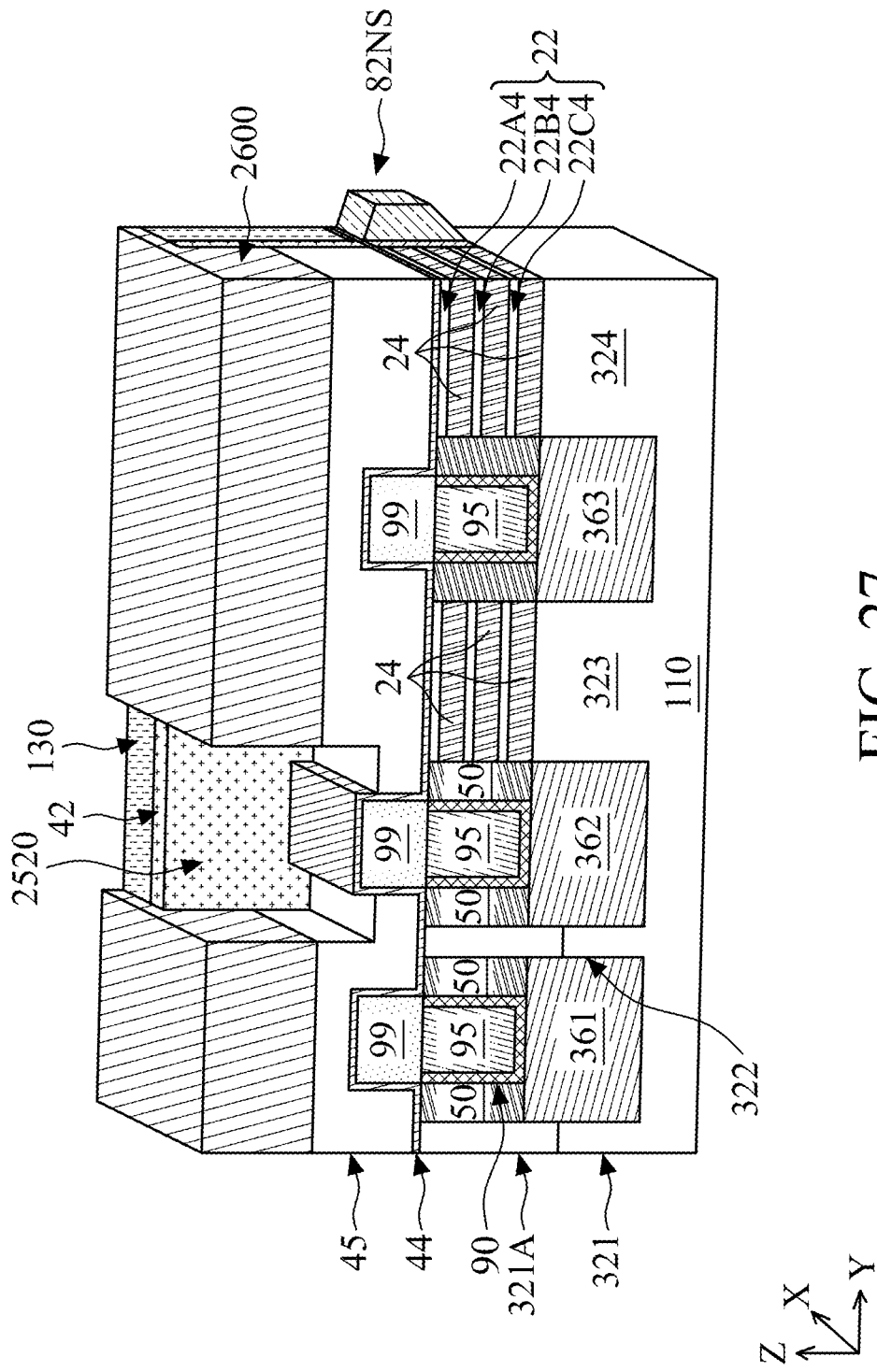
Figure 28A:
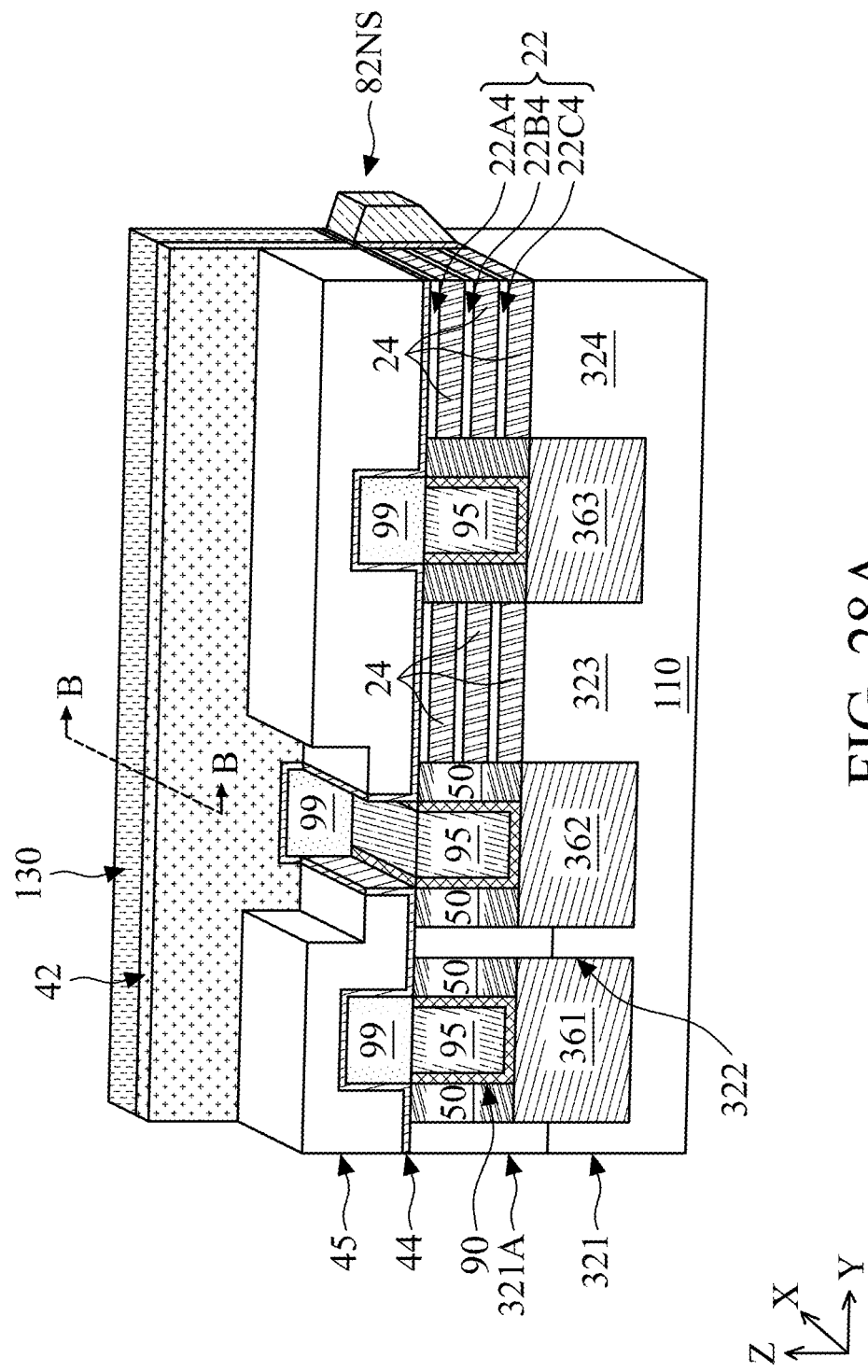
Figure 28B:
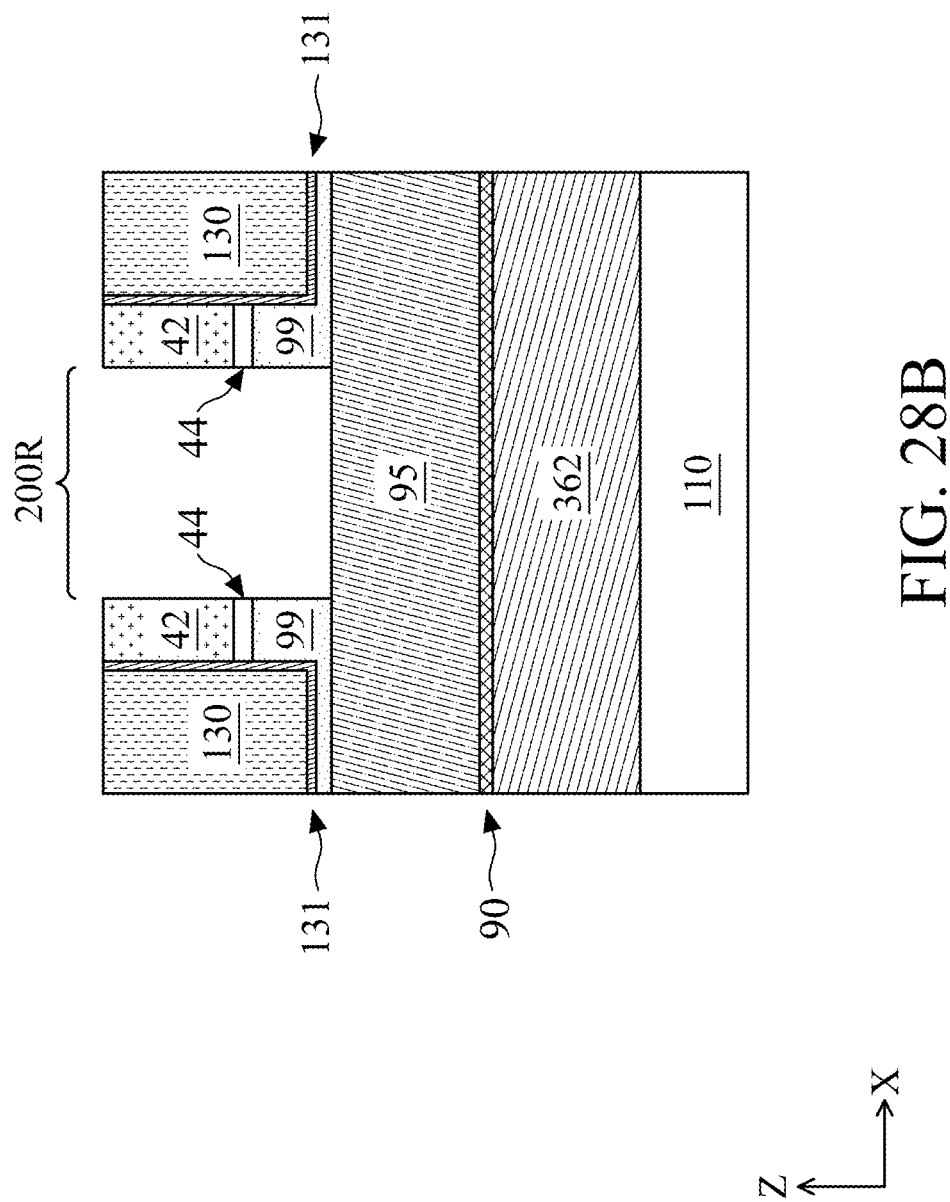
Figure 29:
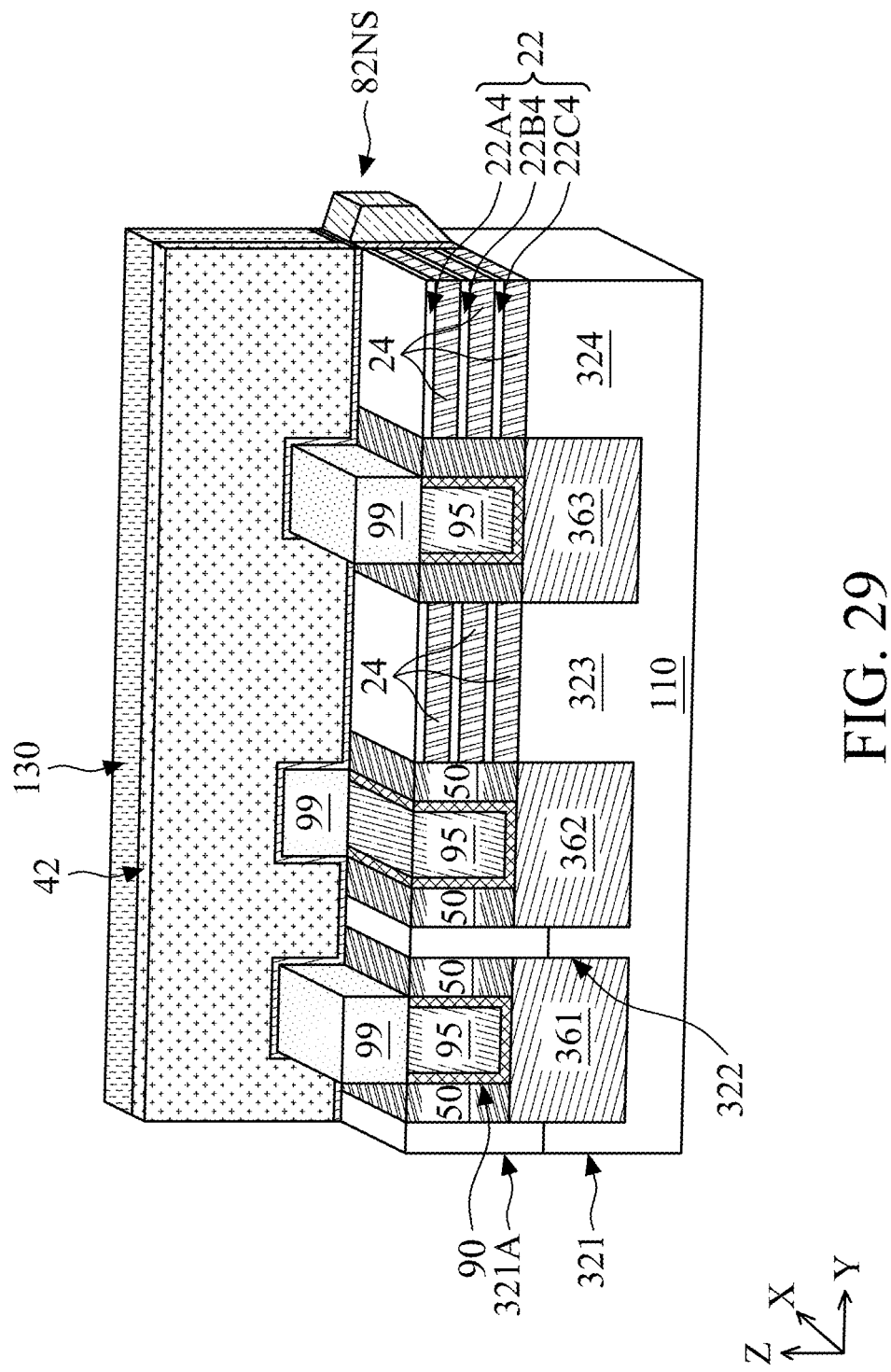
Figure 30:
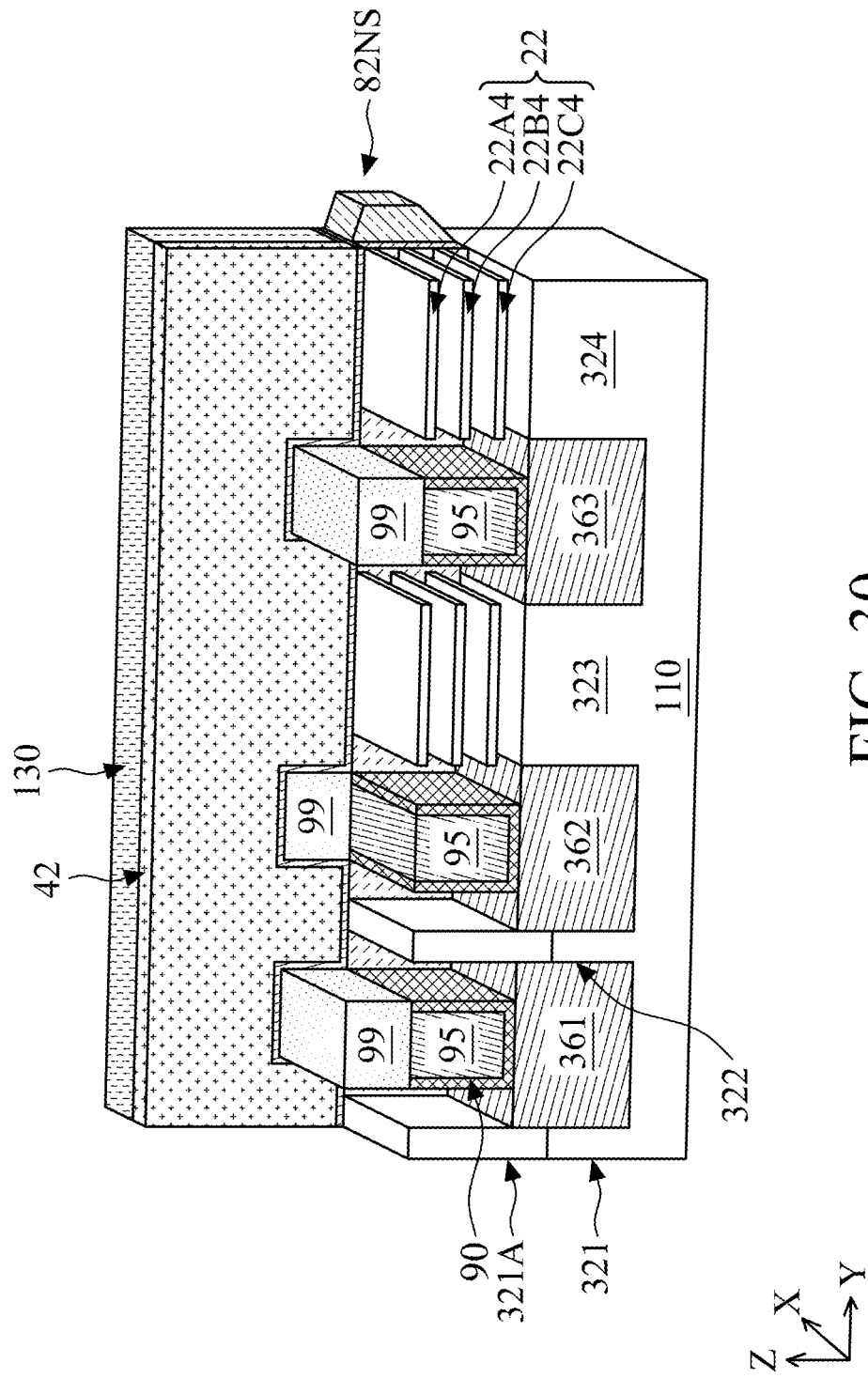
Figure 31:
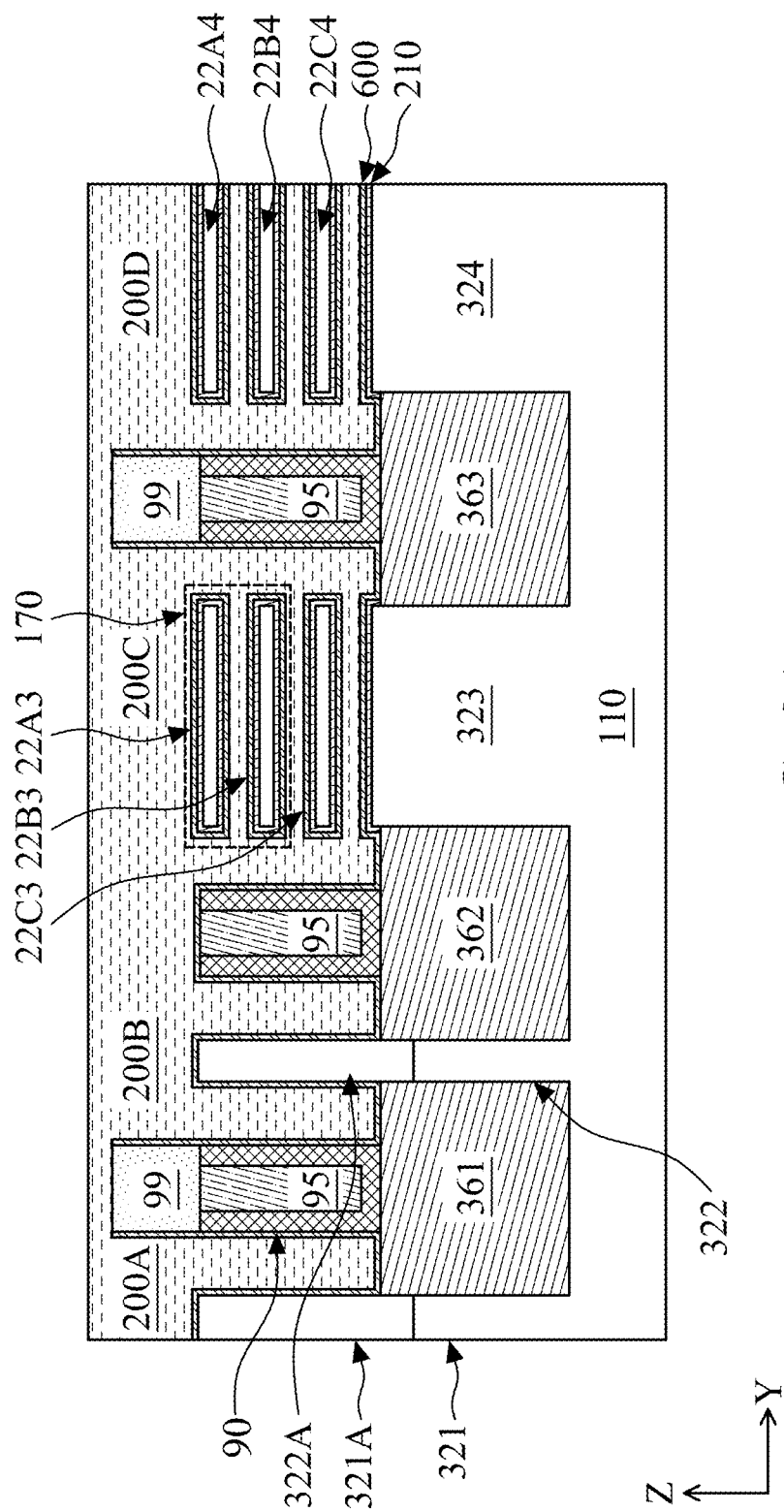

In FIGS. 26-28B, the gate isolation structure 99 overlying the isolation region 362 is removed to facilitate electrical connection of gate structures 200B, 200C in a subsequent operation (see description with reference to FIGS. 29-31). In FIG. 26, a mask layer 2600, which may include one or more photoresist layers, anti-reflective layers (ARC, BARC) or the like, is deposited over the sacrificial gate layer 45, the ILD 130 and the spacer layer 42. The mask layer 2600 may be deposited by a spin-on process, or other suitable process. Following deposition of the mask layer 2600, one or more exposure and removal operations may be performed to form an opening 2510 in the mask layer 2600 overlying and exposing a portion of the sacrificial gate layer 45 over the isolation region 362. The exposure operation may include exposing the mask layer 2600 to light from a light source, such as an extreme ultraviolet (EUV) light source, a deep ultraviolet (DUV) light source, or other appropriate light source. The removal operation may include washing the mask layer 2600 to remove portions of the mask layer 2600 exposed/not exposed to the light.

In FIG. 27, following formation of the opening 2510, the mask layer 2600 is used during an etch operation that removes a portion of the sacrificial gate layer 45 exposed by the opening 2510, which deepens the opening 2510 to form an opening 2520 exposing the gate dielectric layer 44 overlying the gate isolation structure 99 over the isolation region 362. The etch operation may be selective to the sacrificial gate layer 45 and stop at the gate dielectric layer 44. In some embodiments, the etch operation continues somewhat past the level of the gate dielectric layer 44, while leaving the gate dielectric layer 44 substantially intact.

In FIG. 28A, an opening is formed by first removing portions of the gate dielectric layer 44 exposed by the opening 2520 and above the upper surface of the portion of the sacrificial gate layer 45 exposed by the opening 2520. The removing may be by an etching operation selective to the gate dielectric layer 44 that leaves the sacrificial gate layer 45 and the gate isolation structure 99 substantially intact. Following removal of the gate dielectric layer 44 overlying the gate isolation structure 99, another etching operation selective to the gate isolation structure 99 is performed that leaves the gate dielectric layer 44, the sacrificial gate layer 45, and the inactive fin 94 substantially intact. The another etching operation removes the exposed portion of the gate isolation structure 99 overlying the isolation region 362. As shown in FIG. 28B, following the another etching operation, a first portion of the gate isolation structure 99 underlying the spacer layer 42 is thicker than a second portion of the gate isolation structure 99 underlying the ILD 130, and the gate isolation structure 99 is no longer present over the isolation region 362 in a gate region 200R between the spacer layers 42. As shown, portions of the gate dielectric layer 44 remain between the gate isolation structures 99 and the spacer layers 42, and abut the etch stop layer 131.

In FIGS. 29-31, fin channels 22A3-22C4 are released by removal of the nanostructures 24, the mask layer 47, and the dummy gate layer 45. Prior to release, a planarization process, such as a CMP, is performed to level the top surfaces of the dummy gate layer 45 and spacer layer 42. The planarization process may also remove the mask layer 47 on the dummy gate layer 45, and portions of the gate spacer layer 42 along sidewalls of the mask layer 47. Accordingly, the top surfaces of the dummy gate layer 45 are exposed.

In FIG. 29, the dummy gate layer 45 is removed in an etching process, so that recesses are formed. In some embodiments, the dummy gate layer 45 is removed by an anisotropic dry etch process. For example, the etching process may include a dry etch process using reaction gas(es) that selectively etch the dummy gate layer 45 without etching the spacer layer 42. The dummy gate dielectric 44, when present, may be used as an etch stop layer when the dummy gate layer 45 is etched. The dummy gate dielectric 44 may then be removed after the removal of the dummy gate layer 45. The resulting structure is shown in FIG. 29.

In FIG. 30, the nanostructures 24 and the cladding layer 50 are removed to release the nanostructures 22. After the nanostructures 24 are removed, the nanostructures 22 form a plurality of nanosheets that extend horizontally (e.g., parallel to a major upper surface of the substrate 110). The nanosheets may be collectively referred to as the channels 22 of the GAA devices 20C, 20D formed. In some embodiments, the nanostructures 24 are removed by a selective etching process using an etchant that is selective to the material of the nanostructures 24, such that the nanostructures 24 are removed without substantially attacking the nanostructures 22. In some embodiments, the etching process is an isotropic etching process using an etching gas, and optionally, a carrier gas, where the etching gas comprises F2 and HF, and the carrier gas may be an inert gas such as Ar, He, N2, combinations thereof, or the like.

In some embodiments, the nanostructures 24 are removed and the nanostructures 22 are patterned to form channel regions of both PFETs and NFETs. In some other embodiments, the nanostructures 22 may be removed and the nanostructures 24 may be patterned to form channel regions of both PFETs and NFETs.

In some embodiments, the nanosheets 22 of the GAA devices 20C, 20D are reshaped (e.g. thinned) by a further etching process to improve gate fill window. The reshaping may be performed by an isotropic etching process selective to the nanosheets 22. After reshaping, the nanosheets 22 may exhibit the dog bone shape in which middle portions of the nanosheets 22 are thinner than peripheral portions of the nanosheets 22 along the X direction.

In FIG. 31, following release of the nanosheets 22, replacement gates 200, such as the gate structures 200A-200D, are formed, corresponding to operation 1800 of FIG. 36. FIG. 35 is a detailed view of the region 170 of FIG. 31 corresponding to a portion of the gate structure 200C. Each replacement gate 200, as illustrated by the gate structure 200C in FIG. 35, generally includes the interfacial layer (IL, or "first IL" below) 210, at least one gate dielectric layer 600, the work function metal layer 900, and the gate fill layer 290 for an n-type device or a p-type device. In some embodiments, each replacement gate 200 further includes at least one of a second interfacial layer 240 or a second work function layer 700.

With reference to FIG. 35, in some embodiments, the first TL 210 includes an oxide of the semiconductor material of the substrate 110, e.g. silicon oxide. In other embodiments, the first IL 210 may include another suitable type of dielectric material. The first IL 210 has a thickness in a range between about 5 angstroms and about 50 angstroms.

Still referring to FIG. 35, the gate dielectric layer 600 is formed over the first IL 210. In some embodiments, an atomic layer deposition (ALD) process is used to form the gate dielectric layer 600 to control thickness of the deposited gate dielectric layer 600 with precision. In some embodiments, the ALD process is performed using between about 40 and 80 deposition cycles, at a temperature range between about 200 degrees Celsius and about 300 degrees Celsius. In some embodiments, the ALD process uses HfCl4 and/or H2O as precursors. Such an ALD process may form the first gate dielectric layer 220 to have a thickness in a range between about 10 angstroms and about 100 angstroms.

In some embodiments, the gate dielectric layer 600 includes a high-k dielectric material, which may refer to dielectric materials having a high dielectric constant that is greater than a dielectric constant of silicon oxide (k≈3.9). Exemplary high-k dielectric materials include $HfO_2$, HfSiO, HfSiON, HfTaO, HfTiO, HfZrO, $ZrO_2$, $Ta_2O_5$, or combinations thereof. In other embodiments, the gate dielectric layer 600 may include a non-high-k dielectric material such as silicon oxide. In some embodiments, the gate dielectric layer 600 includes more than one high-k dielectric layer, of which at least one includes dopants, such as lanthanum, magnesium, yttrium, or the like, which may be driven in by an annealing process to modify threshold voltage of the GAA device 20C.

With further reference to FIG. 35, the second IL 240 is formed on the gate dielectric layer 600, and the second work function layer 700 is formed on the second IL 240. The second IL 240 promotes better metal gate adhesion on the gate dielectric layer 600. In many embodiments, the second IL 240 further provides improved thermal stability for the gate structure 200C, and serves to limit diffusion of metallic impurity from the work function metal layer 900 and/or the work function barrier layer 700 into the gate dielectric layer 600. In some embodiments, formation of the second IL 240 is accomplished by first depositing a high-k capping layer (not illustrated for simplicity) on the gate dielectric layer 600. The high-k capping layer comprises one or more of the following: HfSiON, HfTaO, HfTiO, HfTaO, HfAlON, HfZrO, or other suitable materials, in various embodiments. In a specific embodiment, the high-k capping layer comprises titanium silicon nitride (TiSiN). In some embodiments, the high-k capping layer is deposited by an ALD using about 40 to about 100 cycles at a temperature of about 400 degrees C. to about 450 degrees C. A thermal anneal is then performed to form the second IL 240, which may be or comprise TiSiNO, in some embodiments. Following formation of the second IL 240 by thermal anneal, an atomic layer etch (ALE) with artificial intelligence (AI) control may be performed in cycles to remove the high-k capping layer while substantially not removing the second IL 240. Each cycle may include a first pulse of $WCl_5$, followed by an Ar purge, followed by a second pulse of $O_2$, followed by another Ar purge. The high-k capping layer is removed to increase gate fill window for further multiple threshold voltage tuning by metal gate patterning.

Further in FIG. 35, after forming the second IL 240 and removing the high-k capping layer, the work function barrier layer 700 is optionally formed on the gate structure 200C, in accordance with some embodiments. The work function barrier layer 700 is or comprises a metal nitride, such as TiN, WN, MoN, TaN, or the like. In a specific embodiment, the work function barrier layer 700 is TiN. The work function barrier layer 700 may have thickness ranging from about 5 A to about 20 A. Inclusion of the work function barrier layer 700 provides additional threshold voltage tuning flexibility. In general, the work function barrier layer 700 increases the threshold voltage for NFET transistor devices, and decreases the threshold voltage (magnitude) for PFET transistor devices.

The work function metal layer 900, which may include at least one of an N-type work function metal layer, an in-situ capping layer, or an oxygen blocking layer, is formed on the work function barrier layer 700, in some embodiments. The N-type work function metal layer is or comprises an N-type metal material, such as TiAlC, TiAl, TaAlC, TaAl, or the like. The N-type work function metal layer may be formed by one or more deposition methods, such as CVD, PVD, ALD, plating, and/or other suitable methods, and has a thickness between about 10 A and 20 A. The in-situ capping layer is formed on the N-type work function metal layer. In some embodiments, the in-situ capping layer is or comprises TiN, TiSiN, TaN, or another suitable material, and has a thickness between about 10 A and 20 A. The oxygen blocking layer is formed on the in-situ capping layer to prevent oxygen diffusion into the N-type work function metal layer, which would cause an undesirable shift in the threshold voltage. The oxygen blocking layer is formed of a dielectric material that can stop oxygen from penetrating to the N-type work function metal layer, and may protect the N-type work function metal layer from further oxidation. The oxygen blocking layer may include an oxide of silicon, germanium, SiGe, or another suitable material. In some embodiments, the oxygen blocking layer is formed using ALD and has a thickness between about 10 A and about 20 A.

FIG. 35 further illustrates the metal fill layer 290. In some embodiments, a glue layer (not separately illustrated) is formed between the oxygen blocking layer of the work function metal layer and the metal fill layer 290. The glue layer may promote and/or enhance the adhesion between the metal fill layer 290 and the work function metal layer 900. In some embodiments, the glue layer may be formed of a metal nitride, such as TiN, TaN, MoN, WN, or another suitable material, using ALD. In some embodiments, thickness of the glue layer is between about 10 A and about 25 A. The metal fill layer 290 may be formed on the glue layer, and may include a conductive material such as tungsten, cobalt, ruthenium, iridium, molybdenum, copper, aluminum, or combinations thereof. In some embodiments, the metal fill layer 290 may be deposited using methods such as CVD, PVD, plating, and/or other suitable processes. In some embodiments, a seam 510, which may be an air gap, is formed in the metal fill layer 290 vertically between the channels 22A3, 22B3. In some embodiments, the metal fill layer 290 is conformally deposited on the work function metal layer 900. The seam 510 may form due to sidewall deposited film merging during the conformal deposition. In some embodiments, the seam 510 is not present between the neighboring channels 22A3, 22B3.

Figure 32:
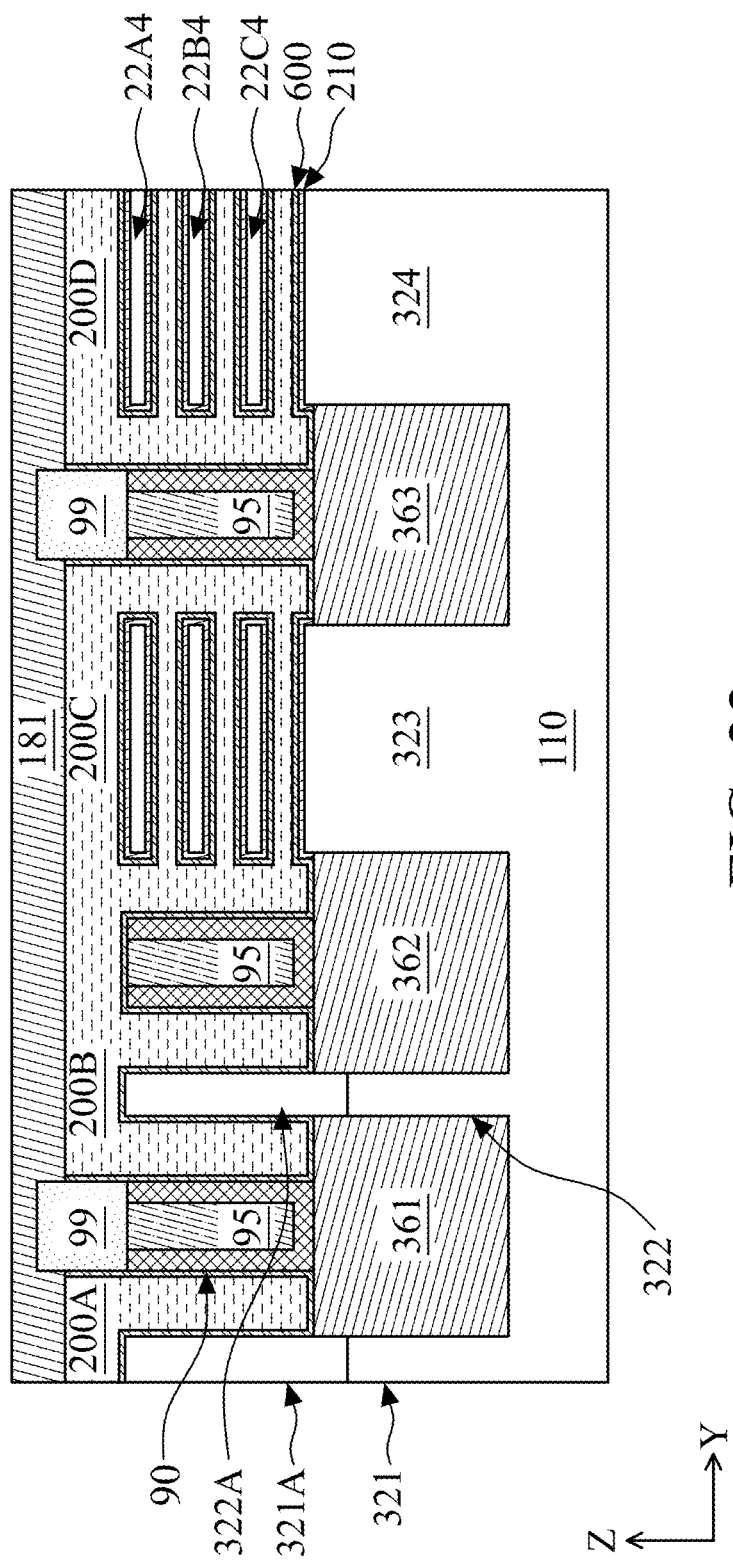
Figure 33:
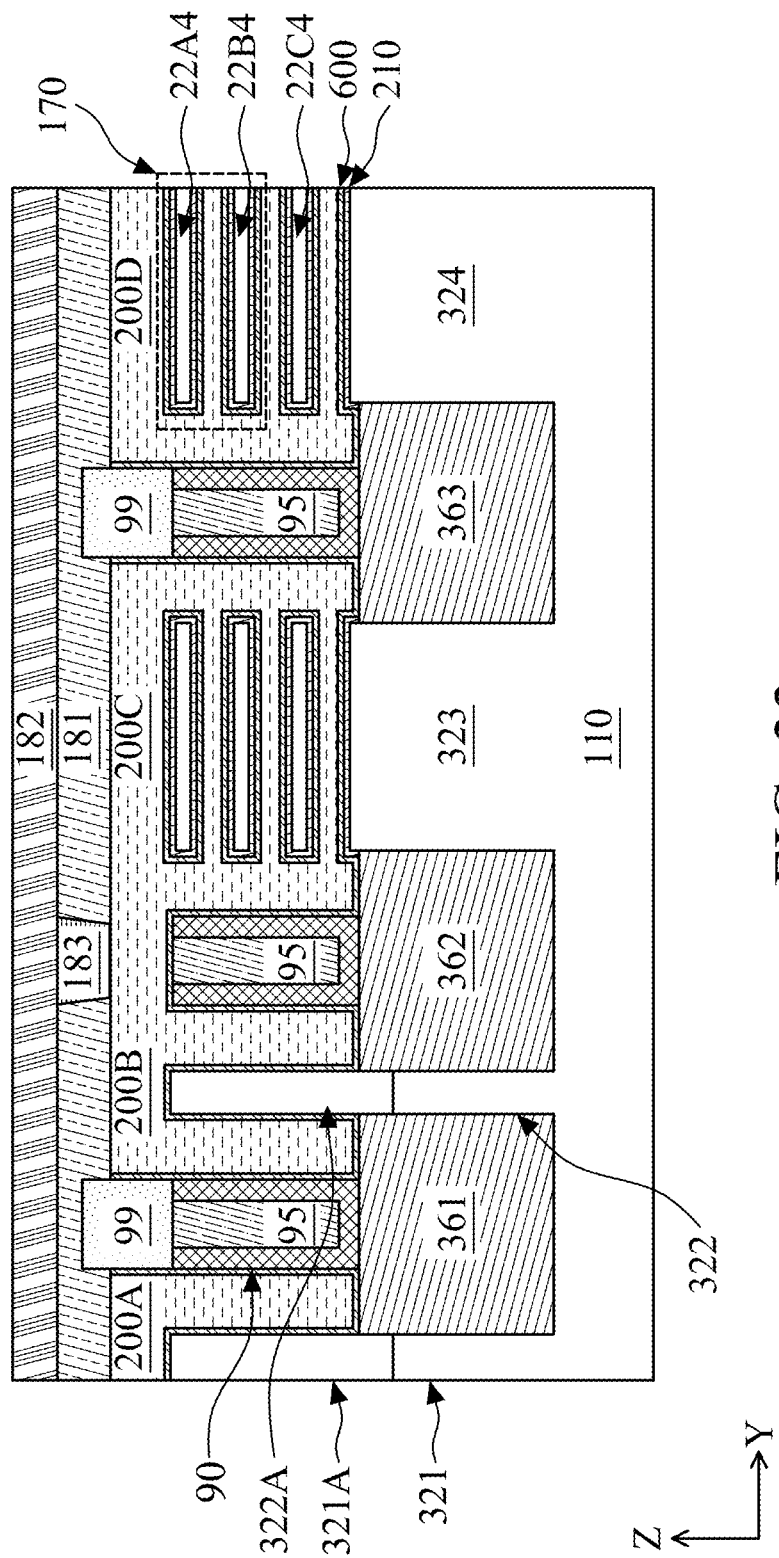
Figure 34:
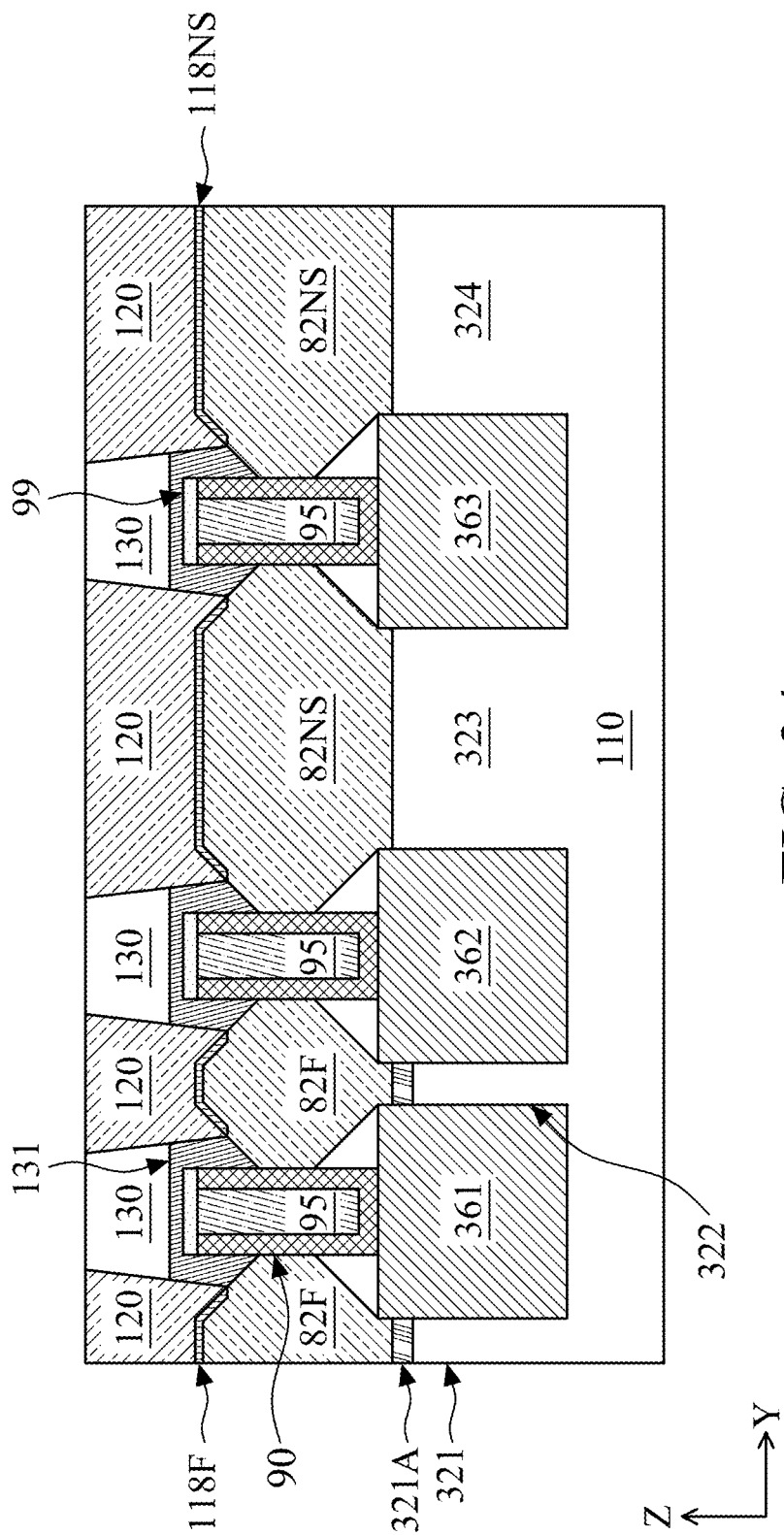

In FIG. 32, a dielectric layer 181 is formed over the gate structures 200A-200D and the gate isolation structures 99. Following formation of the dielectric layer 181, a conductive via 183 may be formed in the dielectric layer 181, as shown in FIG. 33. The conductive via 183 may be formed prior to or simultaneously with an overlying conductive layer 182. The conductive layer 182 may be a wire or trace, in some embodiments. In some embodiments, the conductive layer 182 and the conductive via 183 include one or more of copper, tungsten, aluminum, ruthenium, a combination thereof, or other suitable conductive material.

Additional processing may be performed to finish fabrication of the GAA devices 20C, 20D. For example, gate contacts (not illustrated for simplicity) may be formed to electrically couple to the gate structures 200A-200D. An interconnect structure may then be formed over the source/drain contacts 120 (see FIG. 34) and the gate contacts. The interconnect structure may include a plurality of dielectric layers surrounding metallic features, including conductive traces and conductive vias, which form electrical connection between devices on the substrate 110, such as the GAA devices 20C, 20D, as well as to IC devices external to the IC device 10.

Embodiments may provide advantages. The convergent fin and nanosheet configuration includes the inactive fins 94 for increasing density. Parasitic capacitance (e.g., gate-drain capacitance Cgd) may be reduced, which may increase device speed. Use of the nanosheet transistors 20C, 20D also increases current and mobility. As such, integrated circuit cells employing the convergent configuration enjoy improved performance.

In accordance with at least one embodiment, a device comprises a substrate; a first semiconductor fin over the substrate extending in a first lateral direction; a first vertical stack of semiconductor nanosheets over the substrate extending in the first lateral direction; an inactive fin between the first semiconductor fin and the first vertical stack extending in the first lateral direction; a first gate structure surrounding and covering the first semiconductor fin, and extending in a second lateral direction substantially perpendicular to the first lateral direction; and a second gate structure surrounding and covering the first vertical stack, and extending in the second lateral direction.

In accordance with at least one embodiment, a device comprises a substrate and a nanostructure transistor on the substrate. The nanostructure transistor has a first fin extending from the substrate; at least two nanostructure channels vertically over the first fin; and a first gate structure extending in a first lateral direction. The device further comprises a fin-type transistor on the substrate, which has a second fin including a first portion extending from the substrate to a height lower than an upper surface of the first fin, and a second portion extending from the first portion to a height about level with an upper surface of an upper nanostructure channel of the at least two nanostructure channels; and a second gate structure extending in the first lateral direction. The device further comprises an isolation region in the substrate and between the first transistor and the second transistor in the first direction, the second portion of the second fin buried in the isolation region; and a dielectric fin extending from an upper surface of the isolation region to about an upper surface of the second portion of the second fin.

In accordance with at least one embodiment, a method comprises: forming a lattice structure including alternating layers of a first semiconductor material and a second semiconductor material; forming an opening in the lattice structure; forming a fill layer in the opening including the first semiconductor material; forming fins and nanosheet stacks by etching the fill layer and the lattice structure; forming source/drain features abutting the fins and the nanosheet stacks; forming gate structures over the fins and the nanosheet stacks; and forming contacts to the source/drain features and the gate structures.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming a substrate;
   forming a first semiconductor fin over the substrate extending in a first lateral direction;
   stacking a first vertical stack of semiconductor nanosheets over the substrate extending in the first lateral direction;
   forming an inactive fin between the first semiconductor fin and the first vertical stack extending in the first lateral direction;
   forming a first gate structure surrounding and covering the first semiconductor fin, and extending in a second lateral direction substantially perpendicular to the first lateral direction;
   forming a second gate structure surrounding and covering the first vertical stack, and extending in the second lateral direction; and
   forming a gate isolation feature extending vertically from an upper surface of the inactive fin to a level at or above upper surfaces of the first gate structure and the second gate structure, wherein forming the gate isolation feature includes:
    forming a first portion extending in the first lateral direction and having a first thickness; and
    forming a second portion extending in the first lateral direction from the first portion, and having a second thickness less than the first thickness.

2. The method of claim 1, wherein the inactive fin protrudes 5 nm to 25 nm above an upper surface of the first semiconductor fin.

3. The method of claim 1, wherein the inactive fin protrudes 5 nm to 25 nm above an upper surface of the first vertical stack.

4. The method of claim 1, wherein the gate isolation feature is formed by a self-aligned process following formation of the inactive fin.

5. The method of claim 1, further comprising:
    forming a dielectric layer on the first portion of the gate isolation feature; and
    forming a spacer layer on the dielectric layer.

6. The method of claim 5, further comprising:
    forming an interlayer dielectric over the second portion of the gate isolation feature.

7. The method of claim 1, further comprising:
    forming first and second source/drain features abutting opposite sides of the first semiconductor fin; and
    forming third and fourth source/drain features abutting opposite sides of the first vertical stack.

8. The method of claim 7, wherein:
    the first and third source/drain features are separated by the inactive fin; and
    the second and fourth source/drain features are separated by the inactive fin.

9. The method of claim 8, wherein the first and second source/drain features have smaller dimensions than the third and fourth source/drain features along the second lateral direction.

10. A method, comprising:
    forming a substrate;
    forming a first semiconductor fin over the substrate extending in a first lateral direction;
    stacking a first vertical stack of semiconductor nanosheets over the substrate extending in the first lateral direction;
    forming an inactive fin between the first semiconductor fin and the first vertical stack extending in the first lateral direction;
    forming a first gate structure surrounding and covering the first semiconductor fin, and extending in a second lateral direction substantially perpendicular to the first lateral direction;
    forming a second gate structure surrounding and covering the first vertical stack, and extending in the second lateral direction;
    forming a gate isolation feature extending vertically from an upper surface of the inactive fin to a level at or above upper surfaces of the first gate structure and the second gate structure, wherein forming the gate isolation feature includes:
        forming a first portion extending in the first lateral direction and having a first thickness; and
        forming a second portion extending in the first lateral direction from the first portion, and having a second thickness less than the first thickness;
    forming first and second source/drain features abutting opposite sides of the first semiconductor fin; and
    forming third and fourth source/drain features abutting opposite sides of the first vertical stack.

11. The method of claim 10, wherein the inactive fin protrudes 5 nm to 25 nm above an upper surface of the first semiconductor fin, and the inactive fin protrudes 5 nm to 25 nm above an upper surface of the first vertical stack.

12. The method of claim 10, further comprising:
    forming a dielectric layer on the first portion of the gate isolation feature; and
    forming a spacer layer on the dielectric layer.

13. The method of claim 12, further comprising:
    forming an interlayer dielectric over the second portion of the gate isolation feature.

14. The method of claim 10, wherein:
    the first and third source/drain features are separated by the inactive fin; and
    the second and fourth source/drain features are separated by the inactive fin.

15. The method of claim 14, wherein the first and second source/drain features have smaller dimensions than the third and fourth source/drain features along the second lateral direction.

16. A method, comprising:
    forming a substrate;
    forming a first semiconductor fin over the substrate extending in a first lateral direction;
    stacking a first vertical stack of semiconductor nanosheets over the substrate extending in the first lateral direction;
    forming an inactive fin between the first semiconductor fin and the first vertical stack extending in the first lateral direction, the inactive fin protrudes 5 nm to 25 nm above an upper surface of the first semiconductor fin, and the inactive fin protrudes 5 nm to 25 nm above an upper surface of the first vertical stack;
    forming a first gate structure surrounding and covering the first semiconductor fin, extending in a second lateral direction substantially perpendicular to the first lateral direction;
    forming a second gate structure surrounding and covering the first vertical stack, and extending in the second lateral direction; and
    forming a gate isolation feature extending vertically from an upper surface of the inactive fin to a level at or above upper surfaces of the first gate structure and the second gate structure, wherein forming the gate isolation feature includes:
        forming a first portion extending in the first lateral direction and having a first thickness; and
        forming a second portion extending in the first lateral direction from the first portion, and having a second thickness less than the first thickness.

17. The method of claim 16, wherein the inactive fin protrudes 5 nm to 25 nm above an upper surface of the first semiconductor fin, and the inactive fin protrudes 5 nm to 25 nm above an upper surface of the first vertical stack.

18. The method of claim 16, further comprising:
    forming a dielectric layer on the first portion of the gate isolation feature; and
    forming a spacer layer on the dielectric layer.

19. The method of claim 18, further comprising:
    forming an interlayer dielectric over the second portion of the gate isolation feature.

20. The method of claim 16, further comprising:
    forming first and second source/drain features abutting opposite sides of the first semiconductor fin; and forming third and fourth source/drain features abutting opposite sides of the first vertical stack.

\* \* \* \* \*